US009307667B2

(12) United States Patent
Hirasawa

(10) Patent No.: US 9,307,667 B2
(45) Date of Patent: Apr. 5, 2016

(54) DISPLAY DEVICE

(71) Applicant: Sony Corporation, Tokyo (JP)

(72) Inventor: Takeaki Hirasawa, Tokyo (JP)

(73) Assignee: Sony Corporation (JP)

( * ) Notice: Subject to any disclaimer, the term of this patent is extended or adjusted under 35 U.S.C. 154(b) by 98 days.

(21) Appl. No.: 13/795,329

(22) Filed: Mar. 12, 2013

(65) Prior Publication Data
US 2013/0250550 A1 Sep. 26, 2013

(30) Foreign Application Priority Data

Mar. 22, 2012 (JP) ................. 2012-065096

(51) Int. Cl.
*F21V 21/00* (2006.01)
*H05K 7/14* (2006.01)
*H04N 5/645* (2006.01)
*H04N 5/655* (2006.01)
*G06F 1/16* (2006.01)

(52) U.S. Cl.
CPC *H05K 7/14* (2013.01); *F21V 21/00* (2013.01); *G06F 1/1601* (2013.01); *H04N 5/645* (2013.01); *H04N 5/655* (2013.01); *G06F 2200/1612* (2013.01)

(58) Field of Classification Search
CPC . F21V 21/00; F21V 19/009; G02F 1/133308; G02F 1/133608; G02F 1/133604; G02F 2001/133314; G02F 1/1333; G02F 1/1601; G02F 2200/1612; G02B 6/0088; H04N 5/645; H04N 5/655; H05K 7/14
USPC ............... 362/97.1, 97.3, 632–634, 382, 269; 361/807; 349/58–60
See application file for complete search history.

(56) References Cited

U.S. PATENT DOCUMENTS

| 6,552,761 | B1 * | 4/2003 | Seo et al. .................. 349/58 |
| 6,956,637 | B2 * | 10/2005 | Satonaka ................. 349/187 |
| 6,974,221 | B2 * | 12/2005 | Wu et al. .................. 362/29 |
| 7,604,365 | B2 * | 10/2009 | Chang .................... 362/97.1 |
| 7,993,028 | B2 * | 8/2011 | Wu ........................ 362/269 |
| 8,104,909 | B2 * | 1/2012 | Shin ...................... 362/97.1 |
| 8,430,554 | B2 * | 4/2013 | Hasegawa ............... 362/634 |
| 8,508,684 | B2 * | 8/2013 | Pan et al. ................. 349/58 |
| 8,579,493 | B2 * | 11/2013 | Kawabata et al. ........ 362/633 |
| 2005/0073858 | A1 * | 4/2005 | Kim et al. ............... 362/561 |
| 2006/0039163 | A1 * | 2/2006 | Yun ........................ 362/600 |
| 2006/0139919 | A1 * | 6/2006 | Choi et al. .............. 362/240 |
| 2009/0303413 | A1 * | 12/2009 | Ohta et al. ............... 349/62 |
| 2010/0134704 | A1 * | 6/2010 | Wang ............... H04N 5/645 348/843 |
| 2011/0199754 | A1 * | 8/2011 | Hasegawa .............. 362/97.1 |
| 2012/0092568 | A1 * | 4/2012 | Yokota ................... 348/790 |
| 2014/0009909 | A1 * | 1/2014 | Shima ............. F21V 33/0052 362/97.1 |

FOREIGN PATENT DOCUMENTS

JP 2006-185908 A 7/2006
WO WO 2011001753 A1 * 1/2011

* cited by examiner

*Primary Examiner* — Elmito Breval
*Assistant Examiner* — Arman B Fallahkhair
(74) *Attorney, Agent, or Firm* — Lerner, David, Littenberg, Krumholz & Mentlik, LLP

(57) ABSTRACT

There is provided a display device including a display in which an image is displayed on a display surface, and a back chassis that is disposed on a surface opposite to the display surface of the display. A display holding portion that holds the display is provided in the back chassis.

7 Claims, 24 Drawing Sheets

3 ··· BEZEL
10 ··· DISPLAY HOLDING PORTION
27 ··· DIFFUSION PLATE (OPTICAL CONTROL MEMBER)
28 ··· OPTICAL SHEET
31 ··· DISPLAY
31a ··· DISPLAY SURFACE
32 ··· CUSHION

1 · · · DISPLAY DEVICE
3 · · · BEZEL
4 · · · BACK CHASSIS
31 · · · DISPLAY
31a · · · DISPLAY SURFACE

- 1 · · · DISPLAY DEVICE
- 3 · · · BEZEL
- 4 · · · BACK CHASSIS
- 8 · · · SHEET MOUNTING PORTION
- 10 · · · DISPLAY HOLDING PORTION
- 15 · · · REFLECTION SHEET
- 18 · · · LAMP HOLDER
- 26 · · · LAMP
- 27 · · · DIFFUSION PLATE (OPTICAL CONTROL MEMBER)
- 28 · · · OPTICAL SHEET
- 31 · · · DISPLAY

8 ··· SHEET MOUNTING PORTION

8 ··· SHEET MOUNTING PORTION
15 ··· REFLECTION SHEET

8 · · · SHEET MOUNTING PORTION
15 · · · REFLECTION SHEET
18 · · · LAMP HOLDER
23 · · · PRESSURE PROTRUSION PORTION

4 · · · BACK CHASSIS
10 · · · DISPLAY HOLDING PORTION
12 · · · SHEET HOLDING PORTION
15 · · · REFLECTION SHEET
18 · · · LAMP HOLDER
26 · · · LAMP

10 · · · DISPLAY HOLDING PORTION
12 · · · SHEET HOLDING PORTION
28 · · · OPTICAL SHEET
30a · · · HOLD HOLE

4 ··· BACK CHASSIS
10 ··· DISPLAY HOLDING PORTION
15 ··· REFLECTION SHEET
28 ··· OPTICAL SHEET

4B ··· BACK CHASSIS
7a ··· PRESSURE PROTRUSION PORTION
       (DISPLAY HOLDING PORTION)
7b ··· PRESSURE PROTRUSION PORTION
       (DISPLAY HOLDING PORTION)
31 ··· DISPLAY

- 4B ··· BACK CHASSIS
- 7a ··· PRESSURE PROTRUSION PORTION (DISPLAY HOLDING PORTION)
- 7b ··· PRESSURE PROTRUSION PORTION (DISPLAY HOLDING PORTION)
- 31 ··· DISPLAY

4B · · · BACK CHASSIS
7a · · · PRESSURE PROTRUSION PORTION
       (DISPLAY HOLDING PORTION)
7b · · · PRESSURE PROTRUSION PORTION
       (DISPLAY HOLDING PORTION)
31 · · · DISPLAY

DISPLAY DEVICE

CROSS-REFERENCE TO RELATED APPLICATION

The present application claims priority from Japanese Patent Application No. JP 2012-065096 filed in the Japanese Patent Office on Mar. 22, 2012, the entire content of which is incorporated herein by reference.

BACKGROUND

The present technology relates to a display device, and more particularly, to a display device in which a reduction in manufacturing cost and thinness are achieved by reducing the number of constituent components in a case configuration in which a display holding unit holds a display in a back chassis.

Display devices of television receivers, personal computers, or the like include a display that has a display surface on which an image is displayed.

In such display devices, each unit such as a display or an optical sheet is held to a casing (for example, see JP 2006-185908A).

In a display device disclosed in JP 2006-185908A, a frame (a "top chassis" in JP 2006-185908A) called a bezel, a frame (an "upper mold" or a "middle mold" in JP 2006-185908A) called a middle chassis, and a back chassis (a "bottom mold" in JP 2006-185908A) are installed in order from the front side as a configuration of a casing.

The display is interposed and held from the front and rear sides by the bezel and the middle chassis, and an optical sheet or a diffusion plate, a lamp (backlight), and the like are disposed between the middle chassis and the back chassis.

SUMMARY

In the display device disclosed in JP 2006-185908A, however, a middle chassis is disposed between the bezel and the back chassis in addition to the bezel and the back chassis, and the display is held by the bezel and the middle chassis.

Accordingly, since the middle chassis is present as the configuration of the casing, the number of constituent components may increase, a manufacturing cost may increase, and thus thinness may not be achieved.

It is desirable to provide a display device in which a reduction in manufacturing cost and thinness are achieved by reducing the number of constituent components.

According to a first embodiment of the present technology, there is provided a display device including a display in which an image is displayed on a display surface, and a back chassis that is disposed on a surface opposite to the display surface of the display. A display holding portion that holds the display is provided in the back chassis.

Accordingly, in the display device, the display is held by the display holding portion provided in the back chassis.

Further, according to a second embodiment, the display device may further include a bezel that is formed in a frame shape, and is mounted on the back chassis to press an outer circumference of the display against the display holding portion.

Since the bezel is formed in the frame shape and tightly presses the outer circumference of the display mounted on the back chassis against the display holding portion, the display is held between the bezel and the back chassis.

Further, according to a third embodiment, a cushion may be disposed between the display and the display holding portion. The display may be pressed against the display holding portion through the cushion to be held.

Since the cushion is disposed between the display and the display holding portion and the display is tightly pressed against the display holding portion through the cushion to be held, the display is held by the display holding portion in the state in which the display comes into contact with the cushion.

Further, according to a fourth embodiment, an optical sheet that controls light oriented toward the display may be disposed between the display and the back chassis. A sheet holding portion that holds the optical sheet may be integrally formed in the back chassis.

Since the optical sheet controlling light oriented toward the display is disposed between the display and the back chassis and the sheet holding portion holding the optical sheet is integrally formed in the back chassis, a dedicated member holding the optical sheet is not necessary.

Further, according to a fifth embodiment, a hold hole may be formed in the optical sheet. The sheet holding portion may be formed in a protrusion shape protruding toward the display. The sheet holding portion may be inserted into the hold hole in a manner that the optical sheet is held in the back chassis.

Since the hold hole is formed in the optical sheet, the sheet holding portion is formed in a protrusion shape protruding toward the display, and the sheet holding portion is inserted into the hold hole so that the optical sheet is held in the back chassis, a task of holding the optical sheet is performed by inserting the sheet holding portion into the hold hole.

Further, according to a sixth embodiment, a lamp that emits light to be incident on the display may be disposed. A reflection sheet that reflects the light emitted from the lamp toward the display may be mounted on the back chassis. A sheet mounting portion that mounts the reflection sheet may be integrally formed in the back chassis.

Since the lamp that emits light to be incident on the display is disposed, the reflection sheet reflecting the light emitted from the lamp toward the display is mounted on the back chassis, and the sheet mounting portion mounting the reflection sheet is integrally formed in the back chassis, a dedicated member holding the reflection sheet in the back chassis is not necessary.

Further, according to a seventh embodiment, a lamp holder that is mounted on the back chassis, and holds the lamp may be provided. The lamp holder may be mounted on the sheet mounting portion.

Since the lamp holder that holds the lamp mounted on the back chassis is provided and the lamp holder is mounted on the sheet mounting portion, both the reflection sheet and the lamp holder are mounted on the sheet mounting portion.

Further, according to an eighth embodiment, an optical control member that controls the light emitted from the lamp may be disposed between the display and the back chassis. A pressure protrusion portion that presses the optical control member may be formed in the lamp holder.

Since the optical control member that controls the light emitted from the lamp is disposed between the display and the back chassis and the pressure protrusion portion pressing the optical control member is formed in the lamp holder, a dedicated member determining the pressing position of the optical control member is not necessary.

A display device according to the embodiment of the present technology includes a display in which an image is displayed on a display surface, and a back chassis that is disposed on a surface opposite to the display surface of the display. A display holding portion that holds the display is provided in the back chassis.

Accordingly, it is not necessary to provide a middle chassis holding the display as the configuration of a casing. Further, by reducing the number of constituent components, it is possible to achieve a reduction in a manufacturing cost and miniaturization.

In the display device according to the embodiment of the present technology, a bezel is formed in the frame shape, and presses the outer circumference of the display mounted on the back chassis against the display holding portion.

Accordingly, it is possible to reliably hold the display. Further, it is possible to stabilize the holding state of the display.

In the display device according to the embodiment of the present technology, a cushion is disposed between the display and the display holding portion. The display is pressed against the display holding portion through the cushion to be held.

Accordingly, it is possible to ensure the state in which the display is stably held. Further, it is possible to prevent the display from being cracked and damaged.

In the display device according to the embodiment of the present technology, an optical sheet that controls light oriented toward the display is disposed between the display and the back chassis. A sheet holding portion that holds the optical sheet is integrally formed in the back chassis.

Accordingly, a dedicated member holding the optical sheet is not necessary. By reducing the number of constituent components, it is possible to reduce the manufacturing cost.

In the display device according to the embodiment of the present technology, a hold hole is formed in the optical sheet. The sheet holding portion is formed in a protrusion shape protruding toward the display. The sheet holding portion is inserted into the hold hole in a manner that the optical sheet is held in the back chassis.

Accordingly, a task of holding the optical sheet is easily performed. Further, it is possible to reduce the manufacturing cost due to an improvement in workability.

In the display device according to the embodiment of the present technology, a lamp that emits light to be incident on the display is disposed. A reflection sheet that reflects the light emitted from the lamp toward the display is mounted on the back chassis. A sheet mounting portion that mounts the reflection sheet is integrally formed in the back chassis.

Accordingly, a dedicated member holding the reflection sheet in the back chassis is not necessary, and thus the number of constituent components can be reduced. It is possible to easily perform a task of mounting the reflection sheet on the back chassis.

In the display device according to the embodiment of the present technology, a lamp holder that is mounted on the back chassis, and holds the lamp is provided. The lamp holder is mounted on the sheet mounting portion.

Accordingly, it is not necessary to provide dedicated members holding the lamp holder in the back chassis to hold both the reflection sheet and the lamp holder in the sheet mounting portion, and thus the number of constituent components can be reduced. Thus, it is possible to reduce the manufacturing cost.

In the display device according to the embodiment of the present technology, an optical control member that controls the light emitted from the lamp is disposed between the display and the back chassis. A pressure protrusion portion that presses the optical control member is formed in the lamp holder.

Accordingly, a dedicated member determining the pressure position of the optical control member is not necessary and the position of the diffusion plate can be positioned without an increase in the number of constituent components. Thus, a satisfactory optical performance of the diffusion plate can be ensured while reducing the manufacturing cost.

DETAILED DESCRIPTION OF THE EMBODIMENTS

Figure 1:
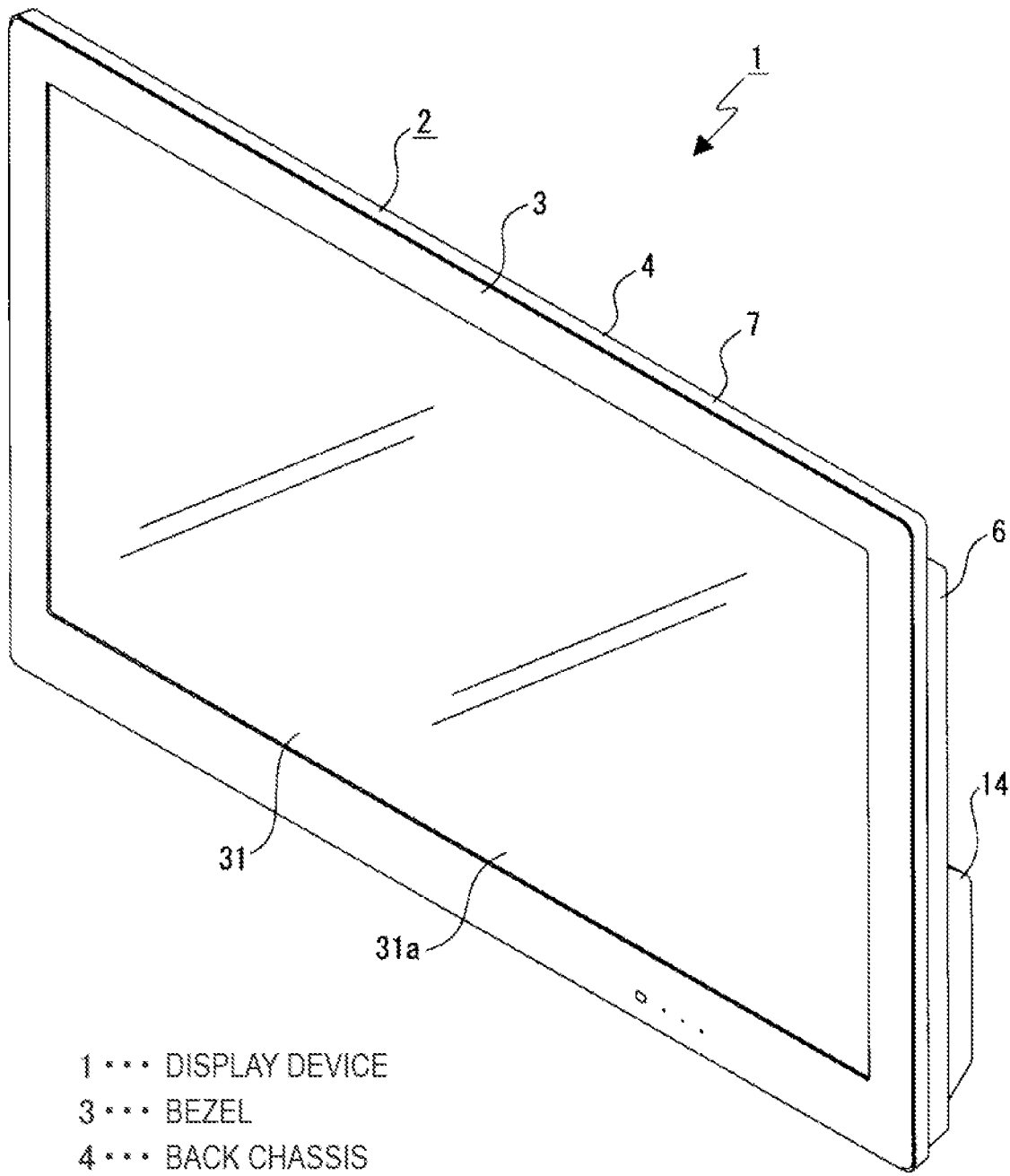
FIG. 1 is a perspective view illustrating a display device together with FIGS. 2 to 24 according to an embodiment of the present technology.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, a display device according to a preferred embodiment of the present technology will be described with reference to the appended drawings.

The display device according to the preferred embodiment of the present technology to be described below is a display device applied to a television receiver that displays an image on a liquid crystal panel installed in a display.

The application scope of the embodiment of the present technology is not limited to the television receiver including the liquid crystal panel, but may be broadly applied to various kinds of television receivers or various kinds of display devices such as monitors used in personal computers irrespective of kinds of displays.

[Configuration of Display Device]

Figure 2:
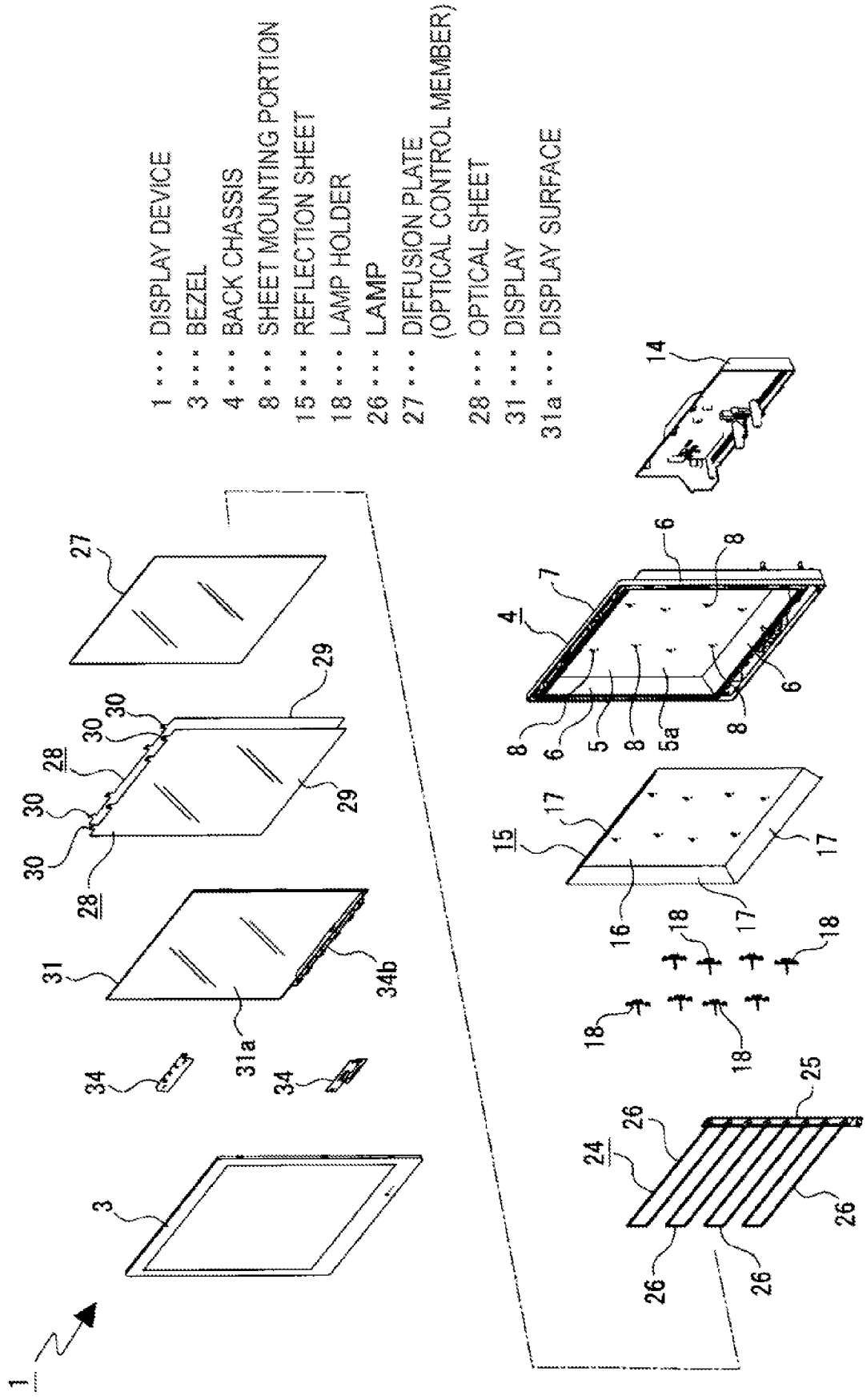
FIG. 2 is an exploded perspective view illustrating the display device.
Figure 3:
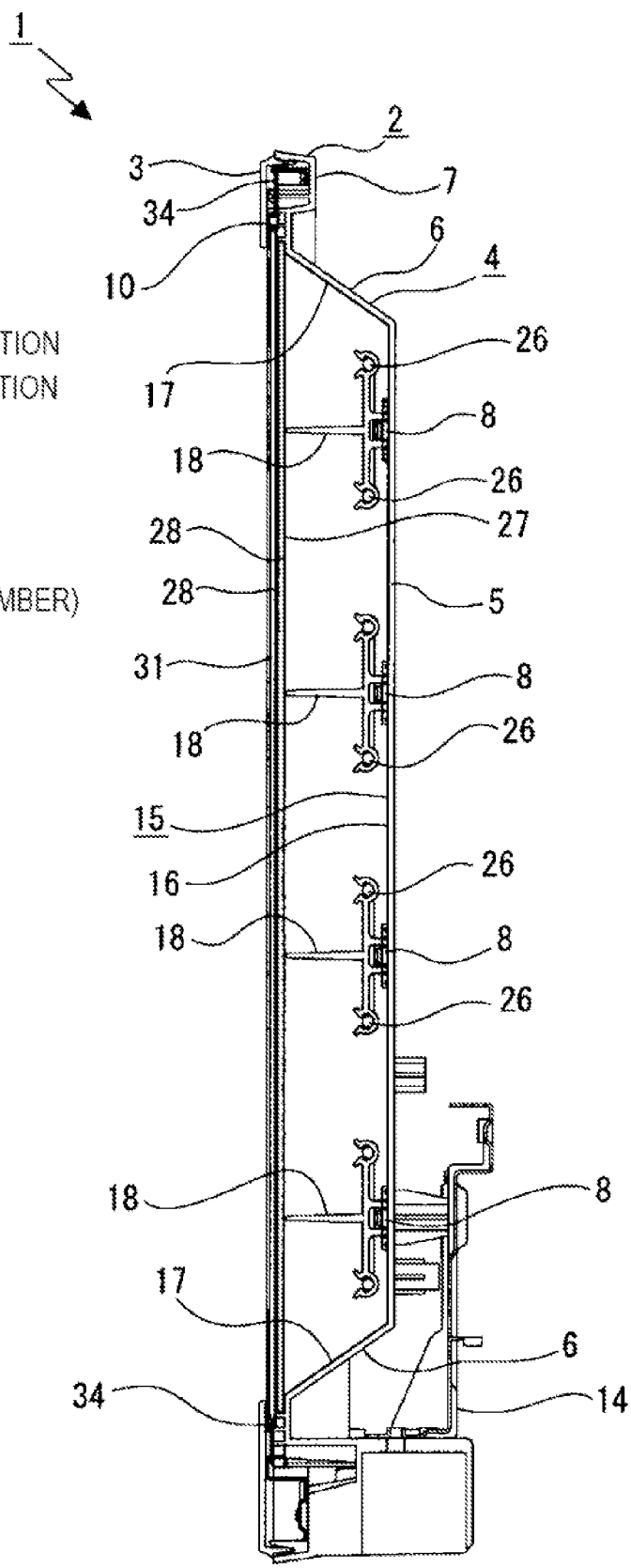
FIG. 3 is a schematic sectional view illustrating the display device.

For example, a display device (television receiver) is formed in a substantially rectangular shape flattened horizontally long and necessary units are disposed in a casing (see FIGS. 1 to 3). The display device 1 is held by, for example, a stand (not shown).

The casing 2 includes a bezel 3 located on the front side and a back chassis 4 located on the rear side.

The bezel 3 is formed in a substantially rectangular frame shape. Further, the bezel 3 may be formed in a frame shape in which four upper, lower, right, and left sides are independently installed as four members and the four members are joined.

Figure 4:
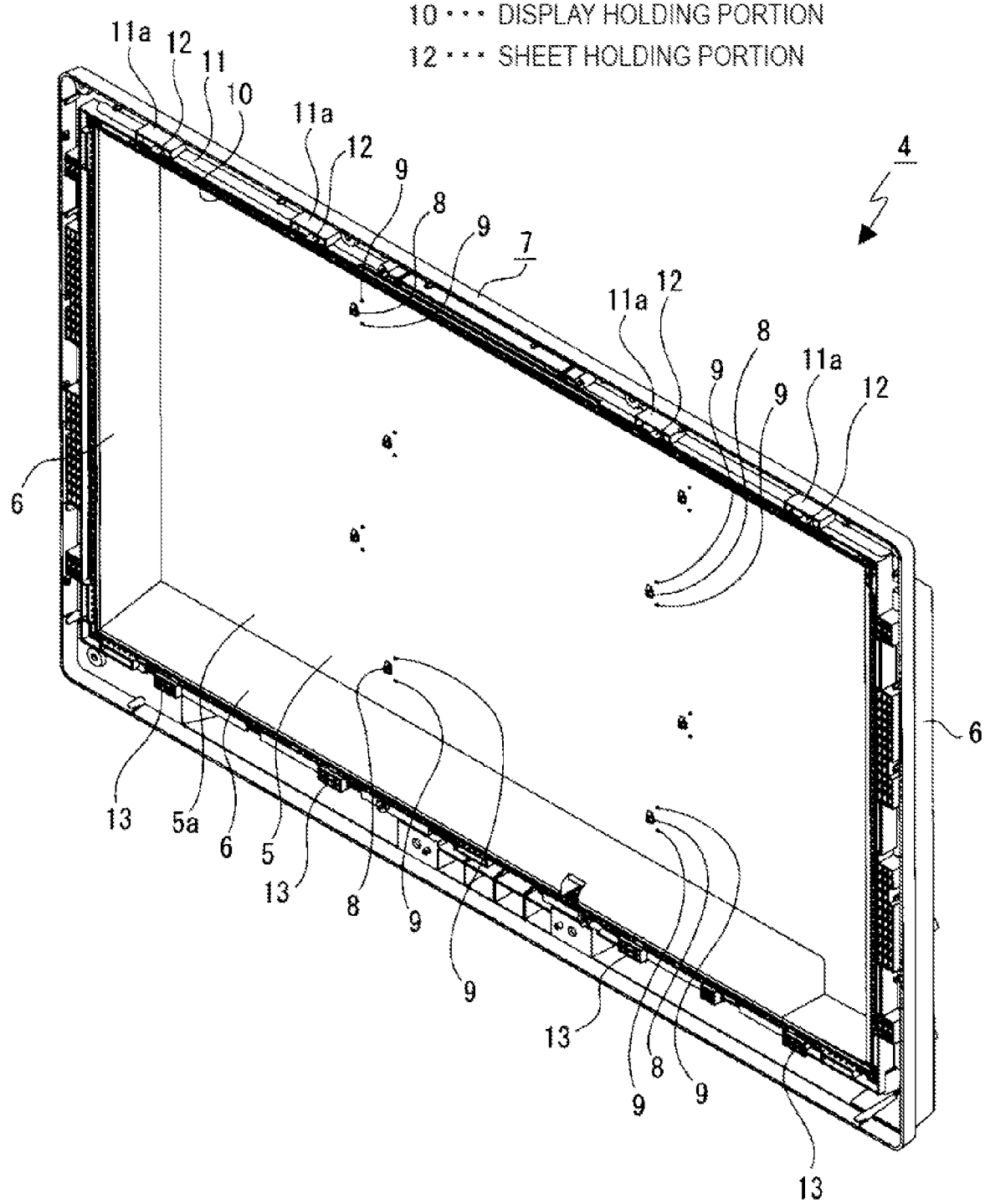
FIG. 4 is a perspective view illustrating a back chassis.
Figure 5:
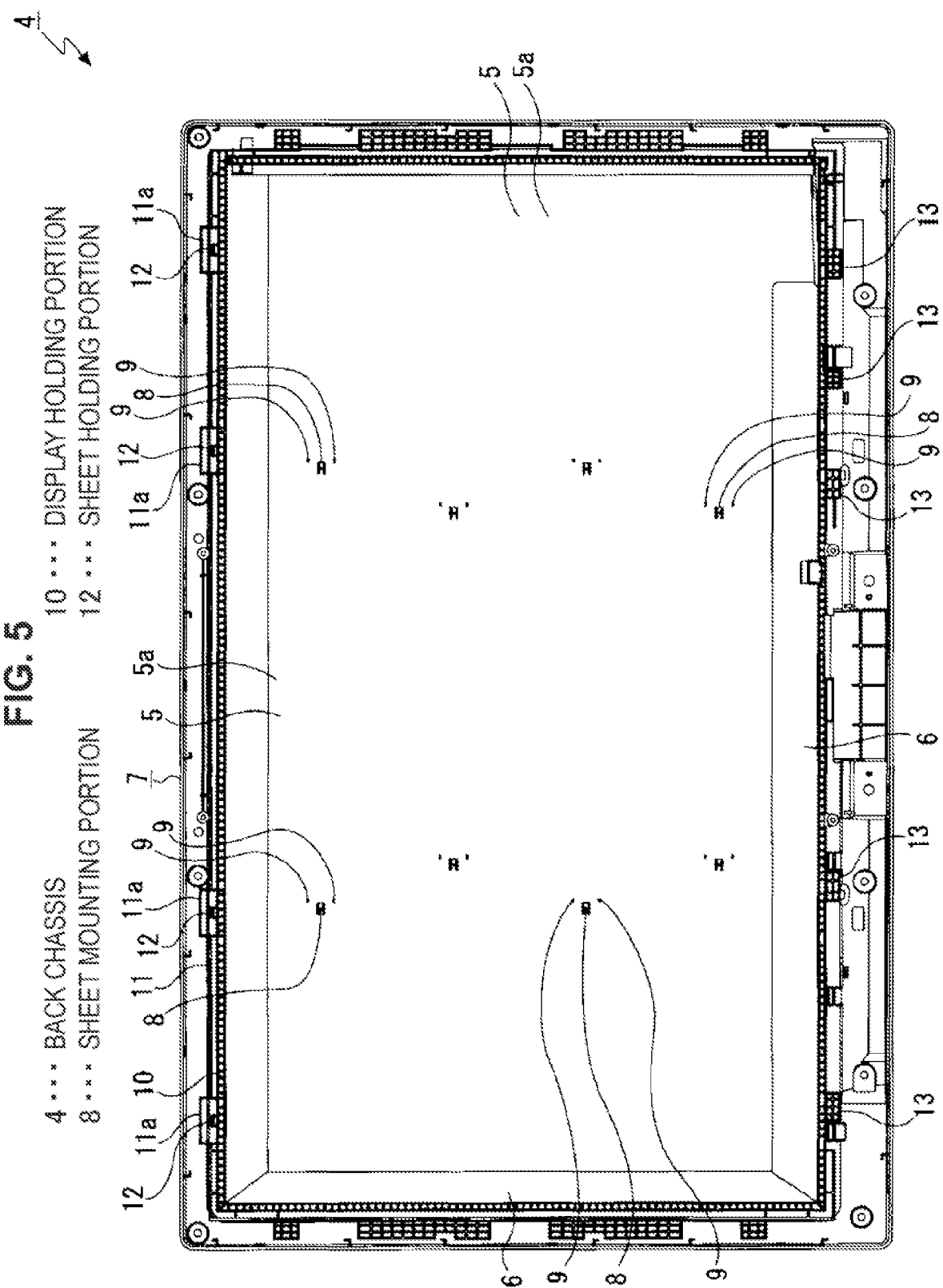
FIG. 5 is a front view illustrating the back chassis.

The back chassis 4 is formed in a shallow box shape opened frontward. As shown in FIGS. 4 and 5, a rectangular base surface portion 5 oriented to the front and rear directions, side surface portions 6, 6, . . . protruding in an inclined state so as to be shifted outward from the outer circumference of the base surface portion 5 to the front side, and a frame-shaped portion 7 continuous to the forward edges of the side surface portions 6, 6, . . . are integrally formed.

Figure 6:
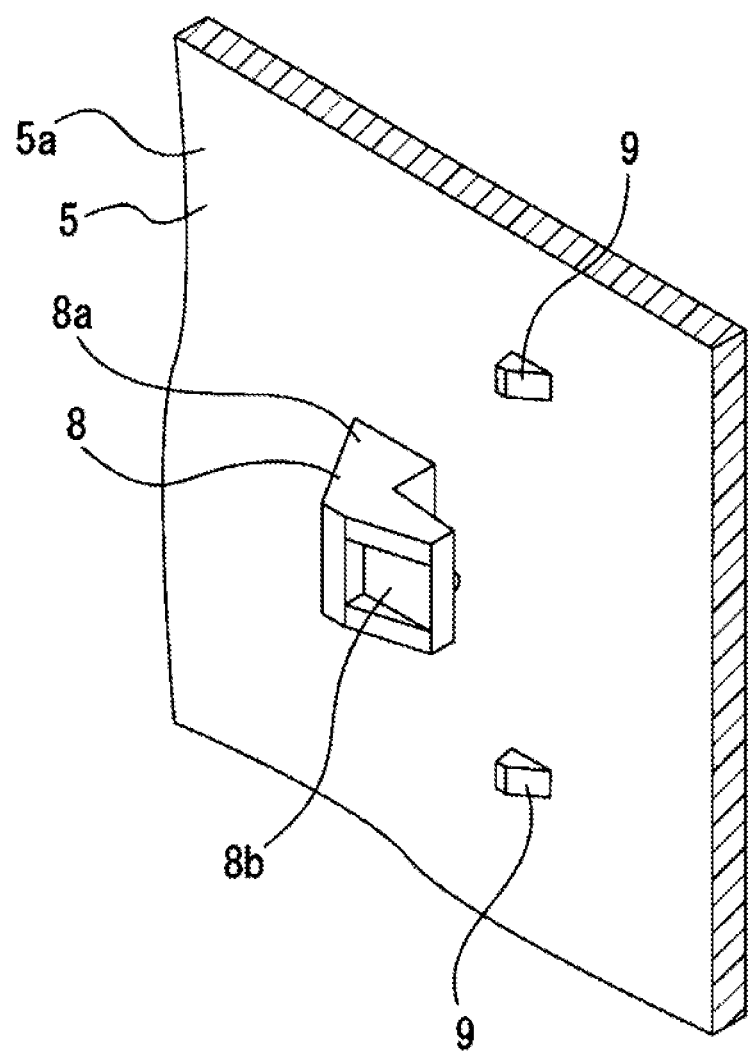
FIG. 6 is an expanded perspective view illustrating a sheet mounting portion and the like installed in the back chassis.

On a front surface 5a of the base surface portion 5, sheet mounting portions 8, 8, . . . and positioning protrusion portions 9, 9, . . . are integrally formed with the base surface portion 5 (see FIG. 6).

The sheet mounting portion 8 includes a base portion 8a protruding frontward from the front surface 5a and a pressure portion 8b protruding sideward from the front end portion of the base portion 8a.

Two positioning protrusion portions 9, 9, . . . are located near each of the sheet mounting portions 8, 8, . . . to be vertically distant and protrude frontward from the front surface 5a.

Figure 7:
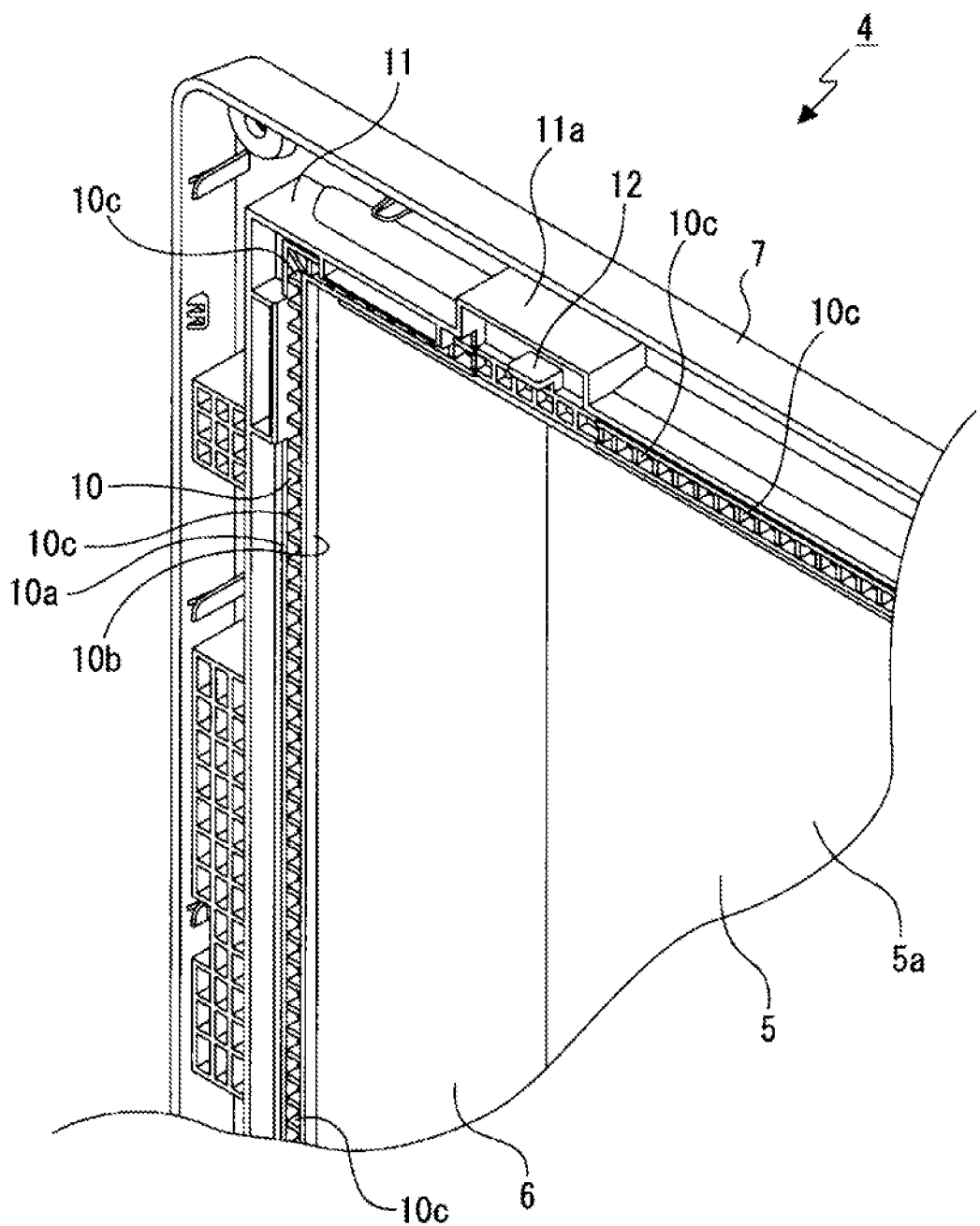
FIG. 7 is an expanded perspective view illustrating a sheet holding portion and the like installed in the back chassis.

A display holding portion 10 opened frontward is provided in the inner circumference portion of the frame-shaped portion 7 (see FIGS. 4, 5, and 7). The display holding portion 10 includes a rectangular outer frame portion 10a protruding frontward, a rectangular inner frame portion 10b located inside the outer frame portion 10a and protruding frontward, and a plurality of rib portions 10c, 10c, . . . located between the outer frame portion 10a and the inner frame portion 10b and protruding frontward. In the rib portion 10c, both ends thereof continue to the inner surface of the outer frame portion 10a and the outer surface of the inner frame portion 10b, respectively, and a front surface thereof is located slightly more backward than the front surfaces of the outer frame portion 10a and the inner frame portion 10b.

In the frame-shaped portion 7, a circumferential wall portion 11 with substantially a frame shape is provided on the outer circumference of the display holding portion 10. In the circumferential wall portion 11, enclosing walls 11a, 11a, . . . are formed at portions protruding frontward and located on the upper sides to be distant right and left. The enclosing wall 11a is formed in an angled "C" shape opened downward.

In the frame-shaped portion 7, sheet holding portions 12, 12, . . . protruding frontward are formed in the portions enclosed by the enclosing walls 11a, 11a, respectively. The sheet holding portions 12, 12, . . . are located outside the display holding portion 10.

Figure 8:
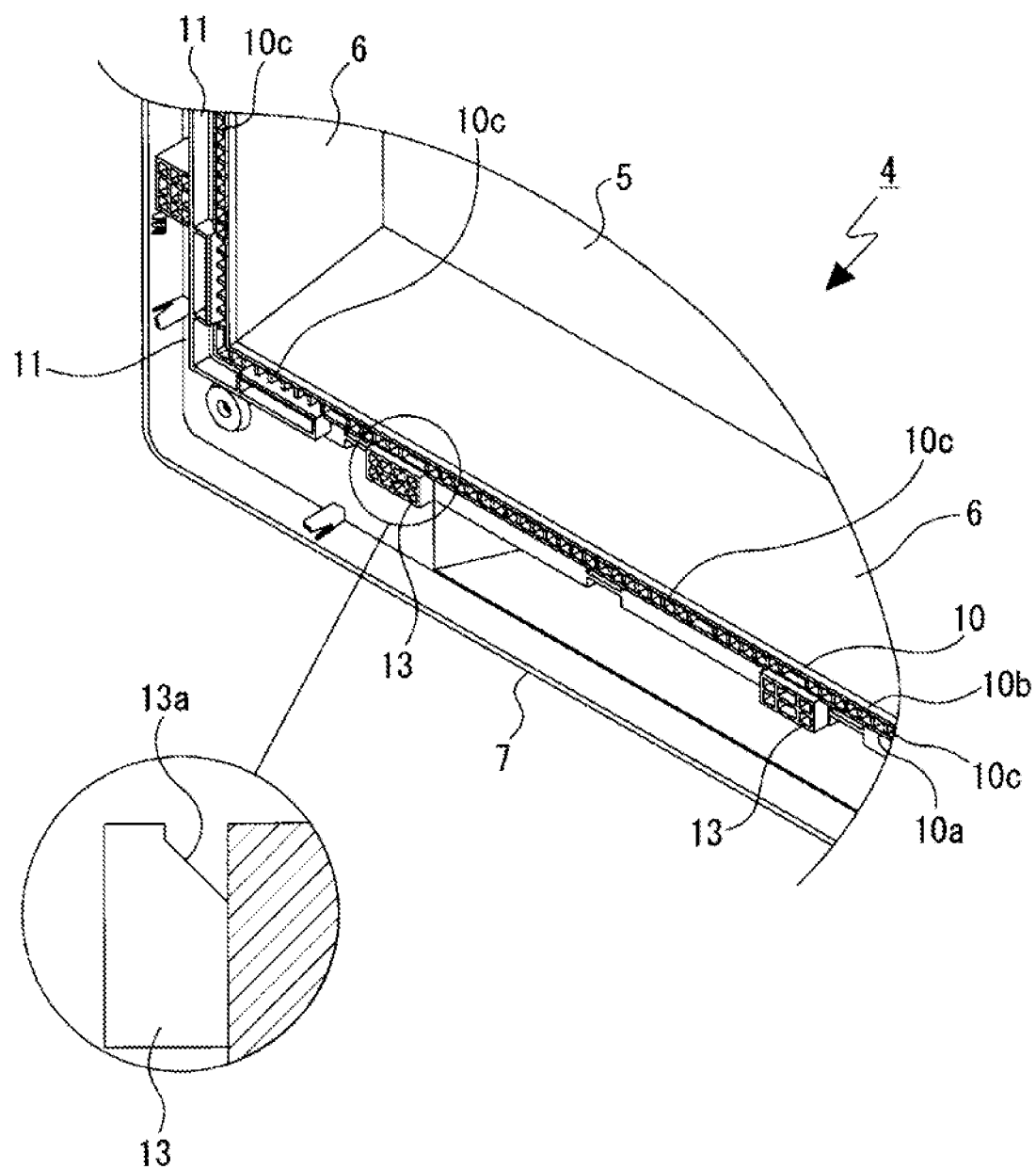
FIG. 8 is an expanded perspective view illustrating reception protrusion portions and the like installed in the back chassis.

Reception protrusion portions 13, 13, . . . are formed at positions near the lower end of the frame-shaped portion 7 to be distant right and left (see FIG. 8). The reception protrusion portion 13 is provided to protrude more frontward than the outer frame portion 10a and includes a frontward rising inclined surface 13a continuous to the front end of the outer frame portion 10a.

A circuit board (not shown) is mounted on the rear surface of the base surface portion 5 of the back chassis 4. The circuit board supplies a current to a display to be described below or supplies a driving current to a lamp unit to be described below and serves as a control circuit that performs control on the entire display device 1.

A rear cover 14 blocking the circuit board is mounted on the rear surface of the base surface portion 5 by screwing (see FIGS. 1 to 3). The rear cover 14 is formed in a shallow box shape opened frontward and is mounted on a portion of the lower end of the back chassis 4.

A reflection sheet 15 is mounted on the front surface of the back chassis 4 (see FIGS. 2 and 3). The reflection sheet 15 includes a base portion 16 that is configured with white and has a rectangular shape oriented in the front and rear directions and inclined portions 17, 17, 17 which continue to the right edge and both front and rear edges of the base portion 16.

Figure 9:
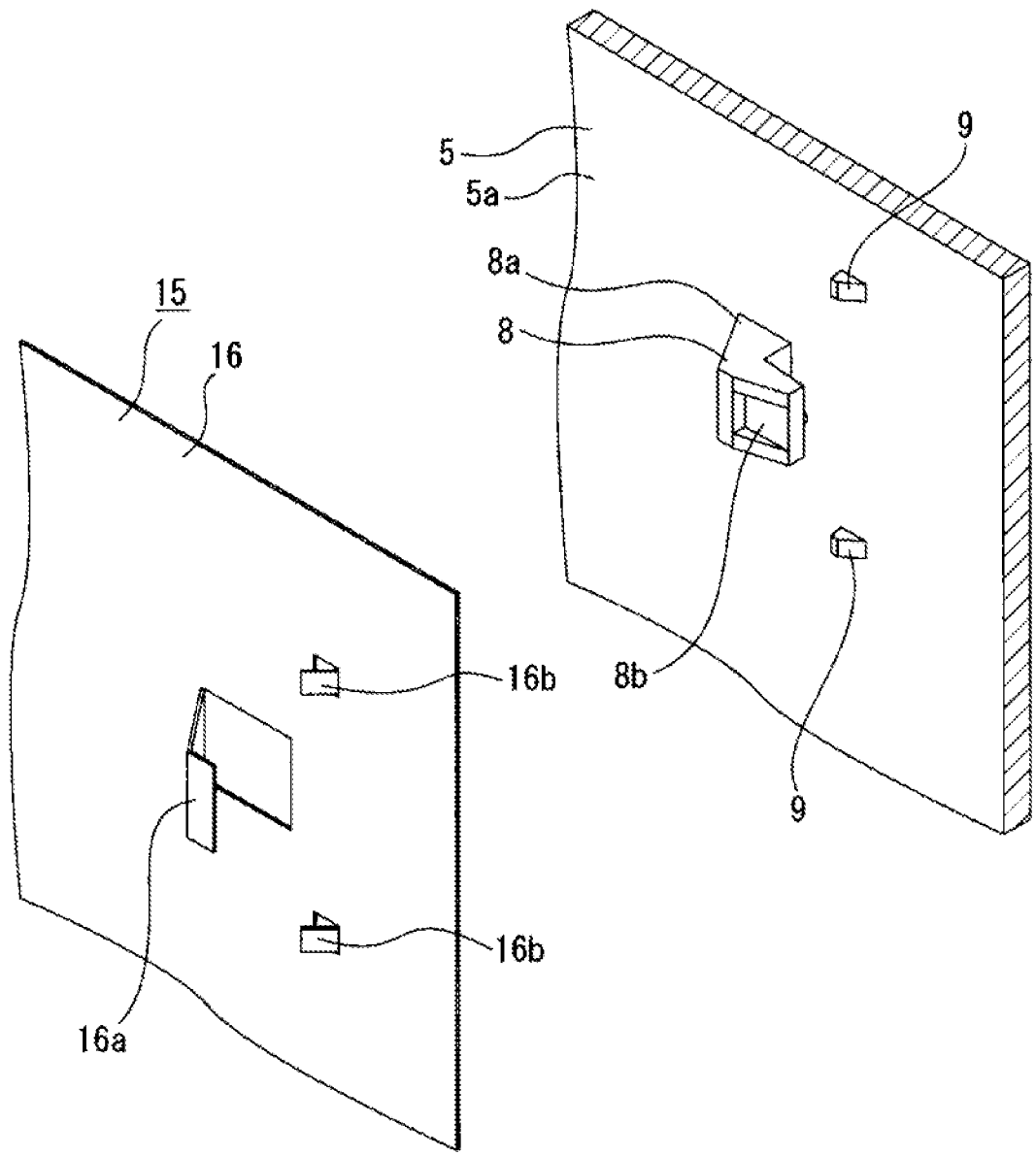
FIG. 9 is an expanded exploded perspective view illustrating parts of the sheet mounting portion and a reflection sheet.

Attachment portions 16a, 16a, . . . all surrounded by slits with an angled "C" shape and positioning portions 16b, 16b, . . . are formed in the base portion 16 (see FIG. 9). Two positioning portions 16b, 16b, . . . are located near each of the attachment portions 16a, 16a, . . . to be vertically distant.

The attachment portions 16a, 16a, . . . and the positioning positions 16b, 16b, . . . all protrude frontward such that parts of the reflection sheet 15 are rolled frontward. Accordingly, insertion holes are formed in the reflection sheet 15 due to the attachment portions 16a, 16a, . . . and the positioning portions 16b, 16b, . . . .

Figure 10:
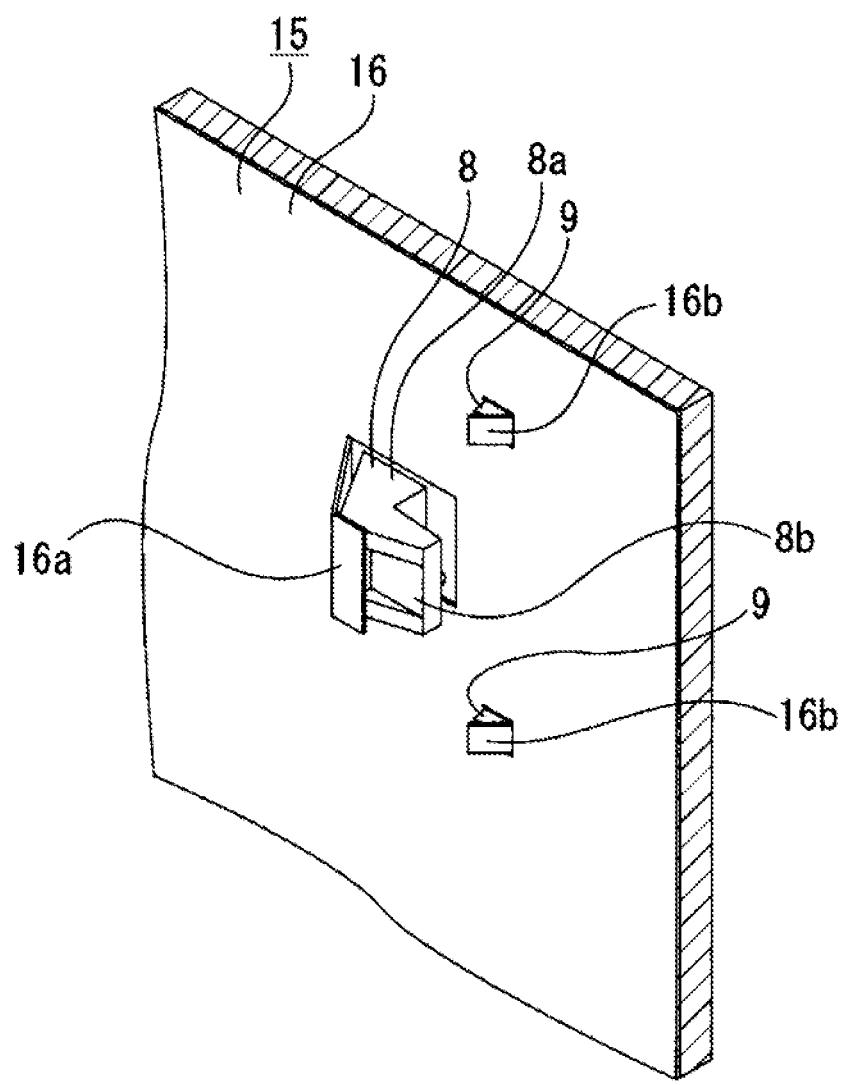
FIG. 10 is an expanded perspective view illustrating a state in which the reflection sheet is mounted on the sheet mounting portion.

The reflection sheet 15 is mounted on the back chassis 4 in such a manner that the sheet mounting portions 8, 8, . . . installed on the base surface portion 5 are respectively inserted into the insertion holes formed in the attachment portions 16a, 16a, . . . (see FIG. 10). At this time, the positioning protrusion portions 9, 9, . . . installed on the base surface portion 5 are respectively inserted into the insertion holds formed due to the positioning portions 16b, 16b, . . . , so that the reflection sheet 15 is positioned to the back chassis 4.

When the reflection sheet 15 is mounted on the back chassis 4, the attachment portions 16a, 16a, . . . come into contact with some of the sheet mounting portions 8, 8, . . . and the positioning portions 16b, 16b, . . . come into contact with some of the positioning protrusion portions 9, 9, . . . . Further, the base portion 16 is disposed to come into contact with the front surface 5a of the base surface portion 5 and the inclined portions 17, 17, 17 are disposed to come into contact with the side surface portions 6, 6, 6.

As described above, the sheet mounting portions 8, 8, . . . mounting the reflection sheet 15 are integrally installed in the back chassis 4.

Accordingly, a dedicated member used to mount the reflection sheet 15 on the back chassis 4 is not necessary, and thus the number of constituent components can be reduced. Further, it is possible to easily perform a task of attaching the reflection sheet 15 to the back chassis 4.

Since substantially the entire surface of the base surface portion 5 and the side surface portions 6, 6, 6 of the back chassis 4 are covered with the reflection sheet 15, high reflection efficiency can be ensured due to the reflection sheet 15. In particular, the reflection sheet 15 is configured with white. Therefore, when the back chassis 4 is formed with black or the like rather than white, the reflection sheet 15 effectively functions to ensure high reflection efficiency.

Lamp holders 18, 18, . . . are mounted on the sheet mounting portions 8, 8, . . . installed on the base surface portion 5 (see FIGS. 2 and 3).

Figure 11:
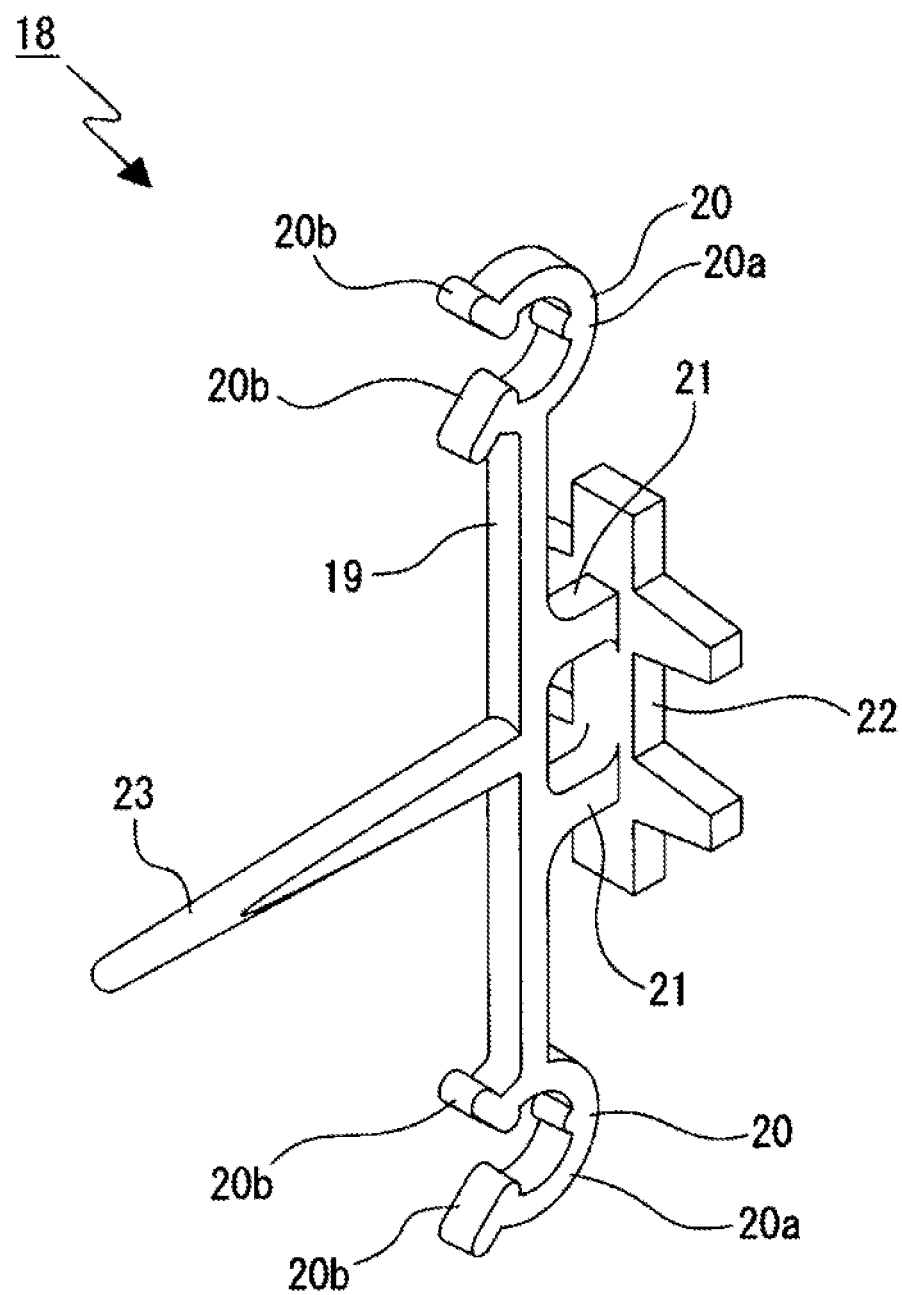
FIG. 11 is an expanded perspective view illustrating a lamp holder.

The lamp holder 18 is formed of, for example, a white resin material and includes a connection portion 19, lamp holding portions 20, 20, leg portions 21, 21, a support portion 22, and a pressure protrusion portion 23 which are integrally formed (see FIG. 11).

The connection portion 19 is formed in a vertically extending bar shape.

The lamp holding portions 20, 20 are formed continuously at both upper and lower ends of the connection portion 19. The lamp holding portion 20 includes an insertion holding portion 20a formed in a substantial arch shape opened frontward and guide portions 20b, 20b formed continuously at the front ends of the insertion holding portion 20a. The guide portions 20b, 20b are inclined to be distant vertically to the front side. In the lamp holding portion 20, the insertion holding portion 20a is elastically deformed so that the guide portions 20b, 20b can be separated and come into contact with each other.

The leg portions 21, 21 protrude from the connection portion 19 backward and are formed to be distant vertically.

The support portion 22 is formed continuously at the rear ends of the leg portions 21, 21 to connect the rear ends of the legs 21, 21.

The pressure protrusion portion 23 is a bar shape protruding frontward from the connection portion 19.

Figure 12:
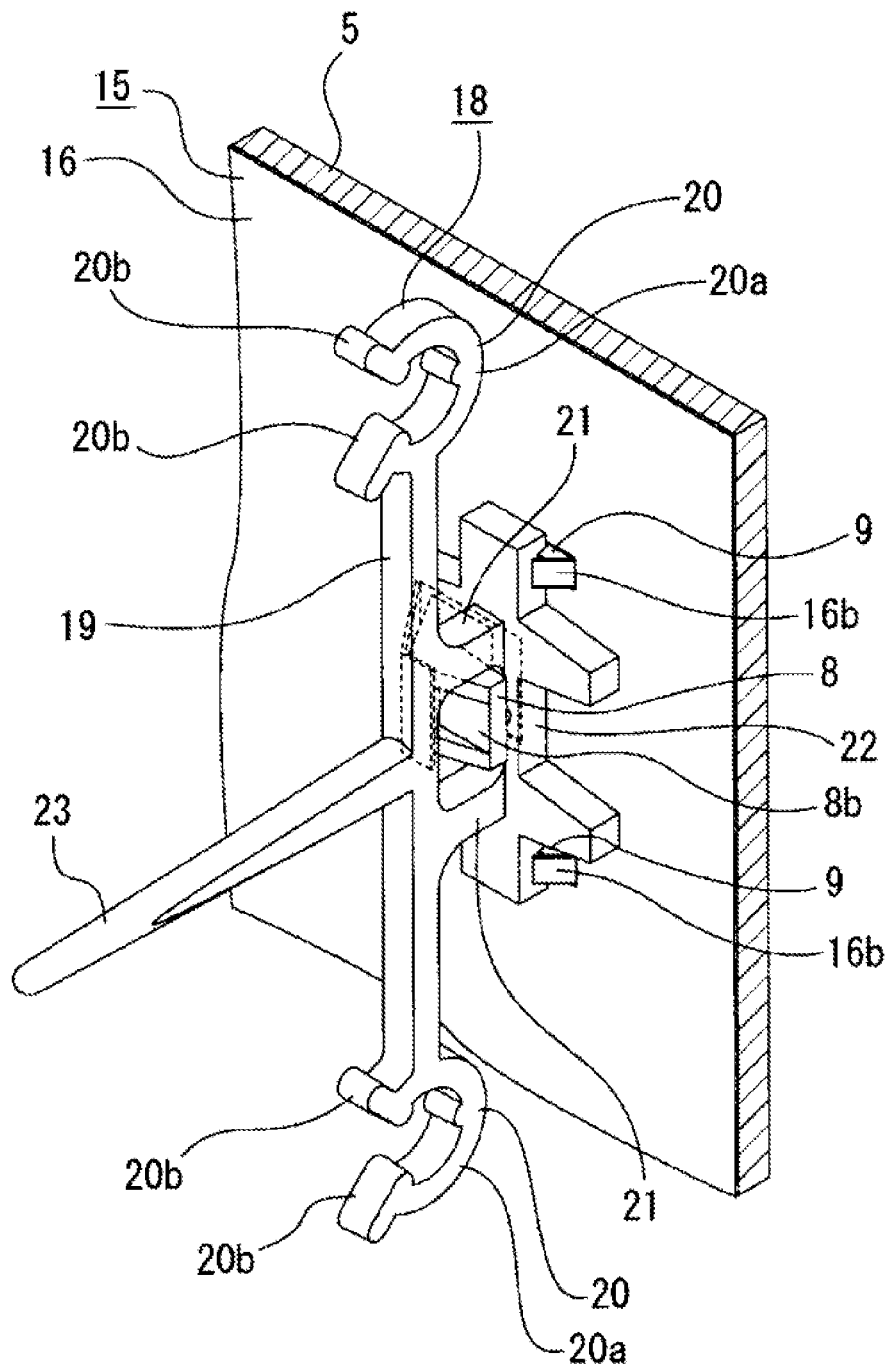
FIG. 12 is an expanded perspective view illustrating a state in which the lamp holder is mounted on the sheet attachment unit.

When the reflection sheet 15 is mounted on the back chassis 4, a part of the support portion 22 of each lamp holder 18 is inserted and fitted between the front surface 5a of the base surface portion 5 and the pressure portion 8b of the sheet mounting portion 8 to be mounted on the base surface portion 5 (see FIG. 12).

The lamp holders 18, 18, . . . hold a lamp unit 24 (see FIGS. 2 and 3). The lamp unit 24 is configured such that lamps 26, 26, . . . functioning as backlight units are connected to a vertically extending electrode portion 25. For example, cold cathode fluorescent lamps (CCFL) are used as the lamps 26, 26, . . . . The lamps 26, 26, . . . are formed in a U shape which is long to the right and left.

The lamp is not limited to the CCFL, but another kind of lamp such as a light emitting diode (LED) may be used.

Figure 13:
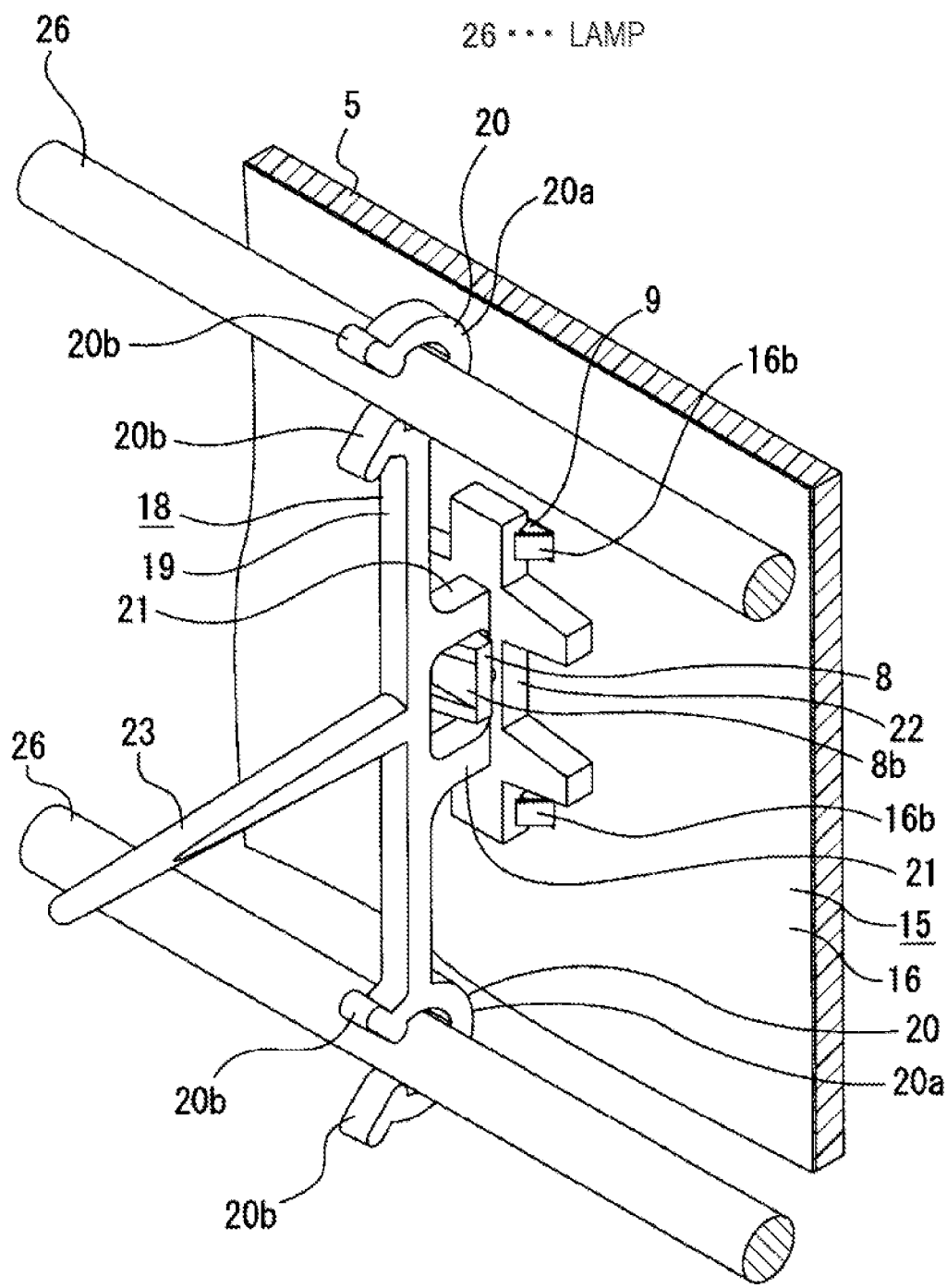
FIG. 13 is an expanded perspective view illustrating a state in which lamps are mounted on the lamp holders.

The lamps 26, 26, . . . of the lamp unit 24 are inserted into the lamp holding portions 20, 20, . . . of the lamp holders 18, 18, . . . to be held (see FIG. 13). The lamps 26 are held by the lamp holding portions 20 such that the insertion holding portions 20a can be expanded to be elastically deformed when the lamps 26 are guided to the guide portions 20b, 20b, . . . and are inserted into the insertion holding portions 20a, and then the insertion holding portions 20a are elastically returned when the lamps 26 are inserted into the insertion holding portions 20a.

Figure 14:
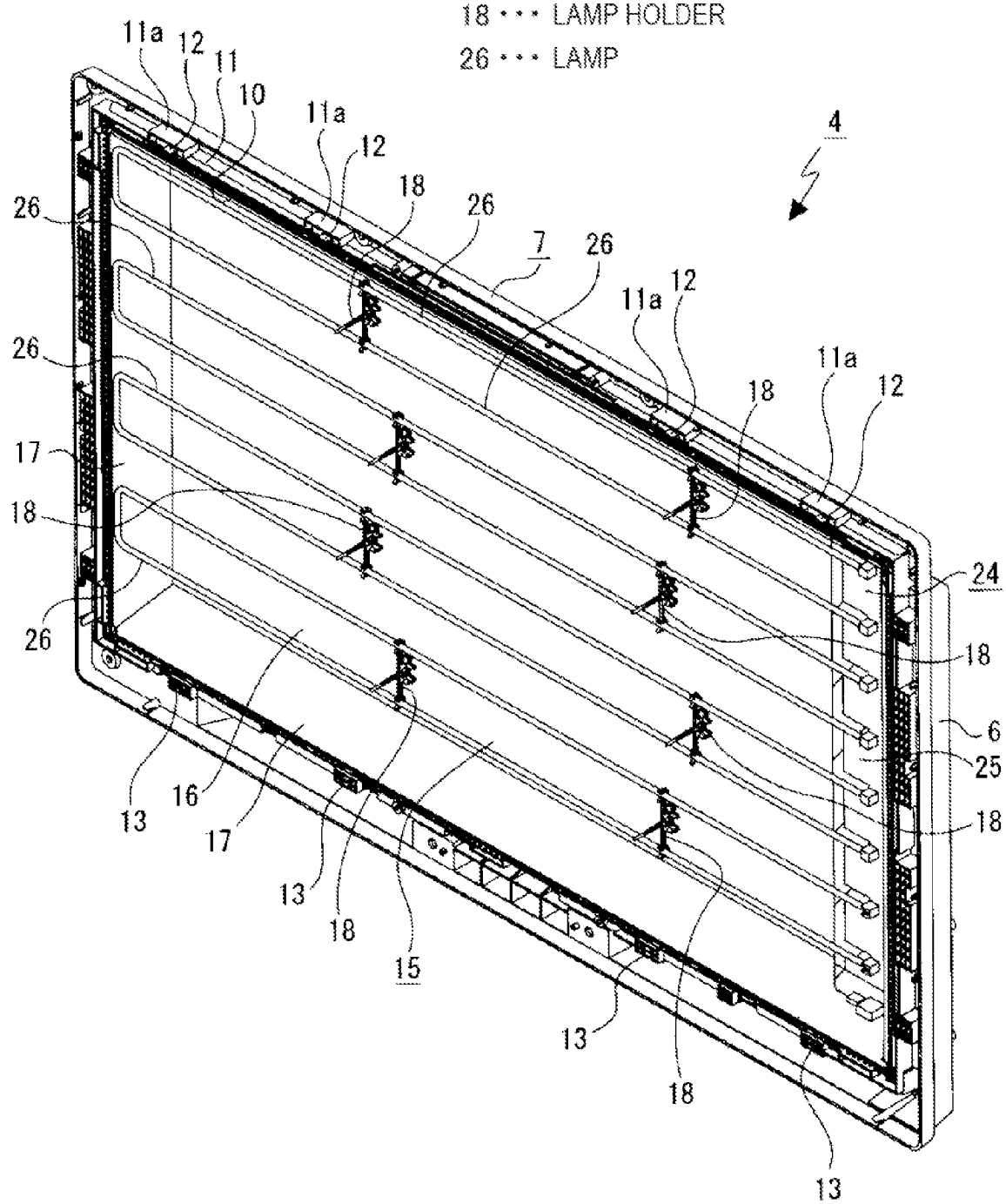
FIG. 14 is a perspective view illustrating the state in which the lamps are mounted on the lamp holders.

The electrode portion 25 of the lamp unit 24 is disposed at the left end of the back chassis 4 (see FIG. 14). The electrode portion 25 is connected to the circuit board mounted on the rear surface of the back chassis 4, a driving current is supplied from a power source circuit of the circuit board to the electrode portion 25, and thus the lamps 26, 26, . . . emit light.

In the display device 1, as described above, the lamp holders 18, 18, . . . are mounted on the sheet mounting portions 8, 8, . . . that mount the reflection sheet 15.

Accordingly, since both the reflection sheet 15 and the lamp holders 18, 18, . . . are mounted on the sheet mounting portions 8, 8, . . . , dedicated mounting portions that mount the lamp holders 18, 18, . . . on the back chassis 4 are not necessary. Therefore, by reducing the number of constituent components, it is possible to reduce a manufacturing cost.

As described above, the lamp holders 18, 18, . . . are formed of a white material. Accordingly, the light emitted from the lamps 26, 26, . . . is easily reflected from the lamp holders 18, 18, . . . an incident light ratio with respect to a display to be described below is improved, and irregularity of luminance caused due to the exposure of a material having a low reflectivity can be prevented.

A diffusion plate 27 is disposed on the front side of the lamp unit 24 (see FIGS. 2 and 3). The diffusion plate 27 is used as an optical control member that has a function of diffusing the light emitted from the lamps 26, 26, . . . and achieving regularity of luminance. The diffusion plate 27 is disposed inside the display holding portion 10 installed in the back chassis 4.

When the diffusion plate 27 is disposed, the front ends of the pressure protrusion portions 23, 23, . . . of the lamp holders 18, 18, . . . are located close to the rear surface of the diffusion plate 27 so that deformation (bending) of the diffusion plate 27 is regulated within a given scope.

Accordingly, by providing the pressure protrusion portions 23 in the lamp holders 18 that hold the lamps 26, a dedicated member determining the pressure position of the diffusion plate 27 is not necessary and the diffusion plate 27 can be positioned without an increase in the number of constituent components. Thus, a satisfactory optical performance of the diffusion plate 27 can be ensured while reducing the manufacturing cost.

Optical sheets 28, 28 are disposed on the front side of the diffusion plate 27. The optical sheets 28, 28 have a function of diffusing light and a function of controlling a light travel direction, and thus it is possible to achieve regularity of the luminance and an improvement in the luminance by the optical sheets 28, 28.

The example in which two optical sheets 28, 28 are installed has been described. However, any number of optical sheets 28 may be set.

Figure 15:
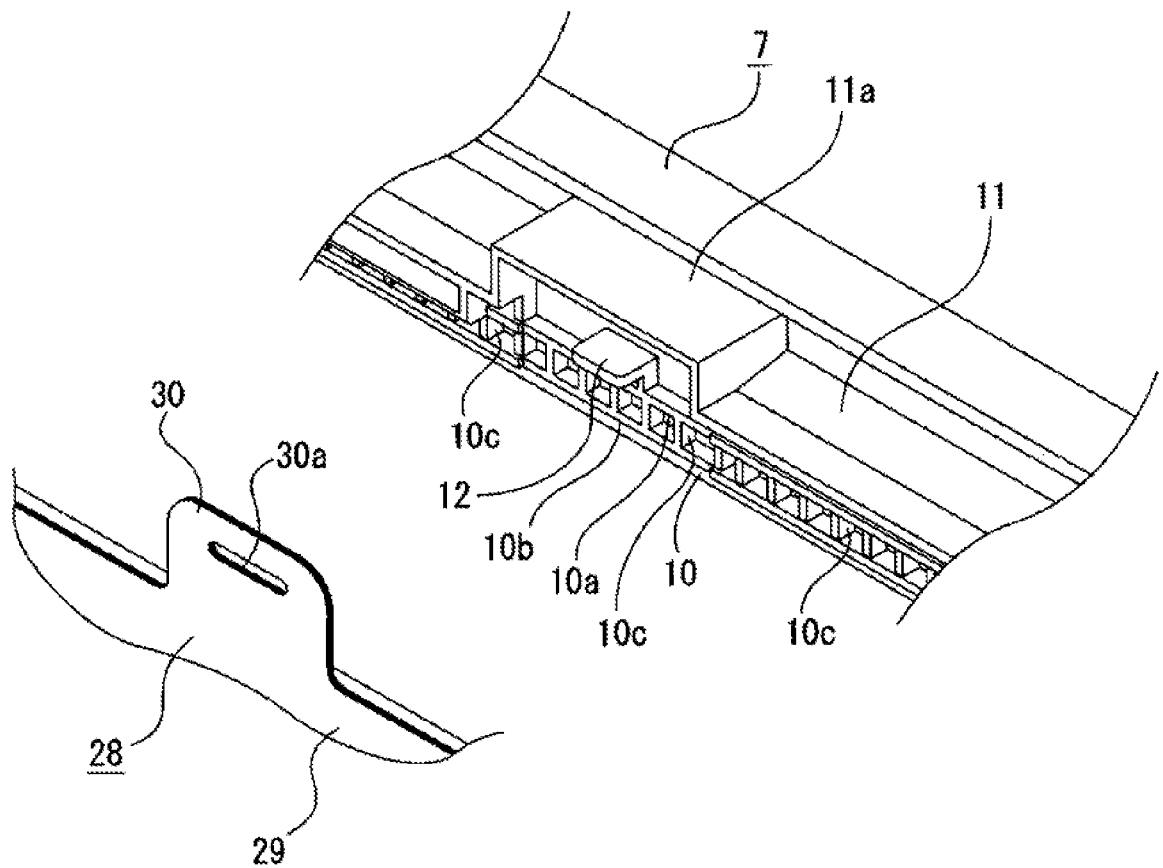
FIG. 15 is an expanded perspective view illustrating a state in which the optical sheet is not yet held in the sheet holding portion.

The optical sheet 28 includes a rectangular functional surface portion 29 and protrusion surface portions 30, 30, . . . protruding upward from the upper edge of the functional surface portion 29. The protrusion surface portions 30, 30, . . . are formed to be distant right and left. A hold hole 30a is formed in the protrusion surface portion 30 (see FIG. 15).

Figure 16:
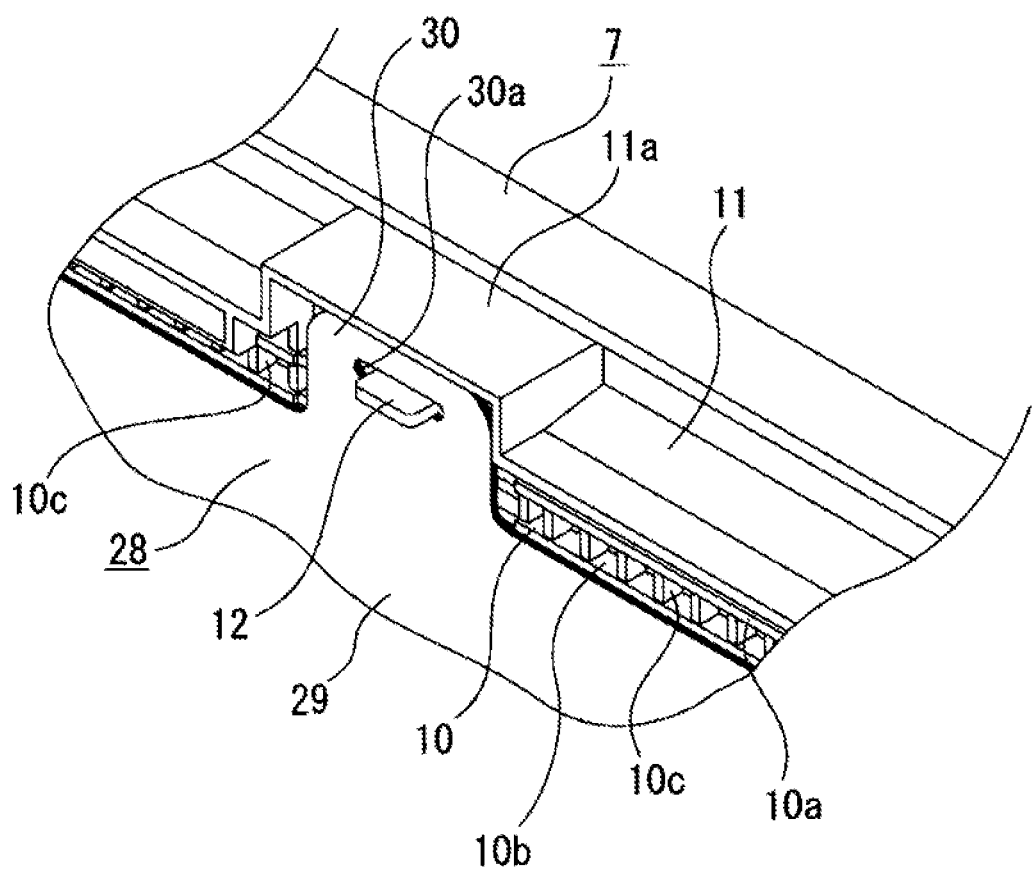
FIG. 16 is an expanded perspective view illustrating a state in which the optical sheet is held in the sheet holding portion.

When the optical sheets 28, 28 are superimposed front and rear, the sheet holding portions 12, 12, . . . are respectively inserted into the hold holes 30a, 30a, . . . to be held in the back chassis 4 (see FIG. 16).

Figure 17:
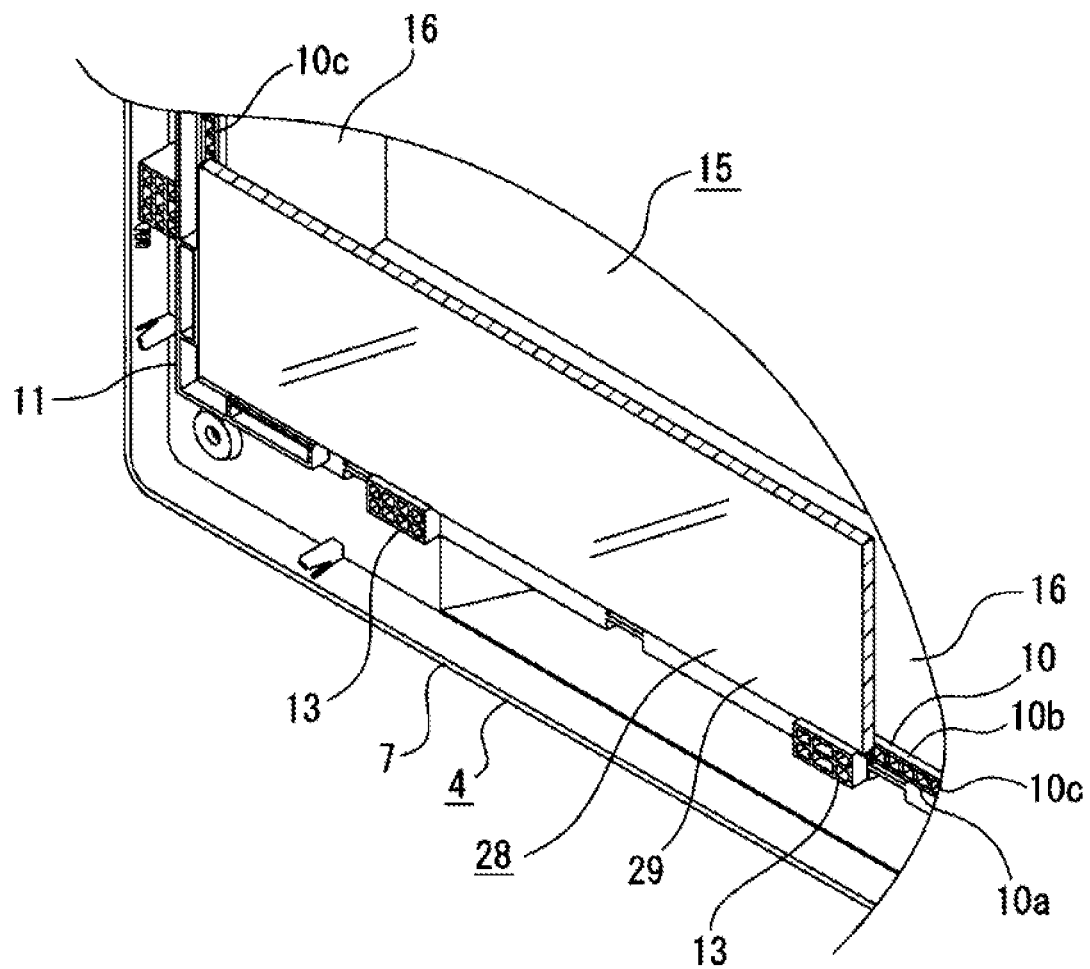
FIG. 17 is an expanded perspective view illustrating a state in which the optical sheet is held in reception protrusion portions.

When the optical sheets 28, 28 are held in the back chassis 4, the lower edges of the optical sheets 28, 28 engage with the rear ends of the inclined portions 13a, 13a, ... of the reception protrusion portions 13, 13, ... installed in the back chassis 4 to be positioned in the front and rear directions of the optical sheets 28, 28 (see FIG. 17). Accordingly, the optical sheets 28, 28 can stably be held in the back chassis 4.

When the optical sheets 28, 28 are held in the back chassis 4, the functional surface portions 29, 29 of the optical sheets 28, 28 are located inside the display holding portion 10 and come into contact with or closely approximate the front surface of the diffusion plate 27.

In the display device 1, as described above, the sheet holding portions 12, 12 holding the optical sheets 28, 28 in the back chassis 4 are integrally formed.

Accordingly, dedicated members holding the optical sheets 28, 28 are not necessary. Thus, by reducing the number of constituent components, it is possible to reduce the manufacturing cost.

The sheet holding portions 12, 12, ... are inserted into the hold holes 30a, 30a, ... formed in the protrusion surface portions 30, 30, ... so that the optical sheets 28, 28 are held in the back chassis 4.

Accordingly, a task of holding the optical sheets 28, 28 can be easily performed. Thus, since workability is improved, it is possible to achieve the reduction in the manufacturing cost.

A display 31 is held in the display holding portion 10 of the back chassis 4 (see FIGS. 2 and 3). For example, the display 31 is a liquid crystal panel in which a glass substrate, a polarizing sheet, and the like are stacked and is configured as a display surface 31a in which an image is displayed on a front surface.

The display 31 is formed in a substantially rectangular shape and includes a connection terminal portion 31b at the lower end. The display 31 is installed as a display region in which an image is displayed in a portion other than the outer circumference.

Figure 18:
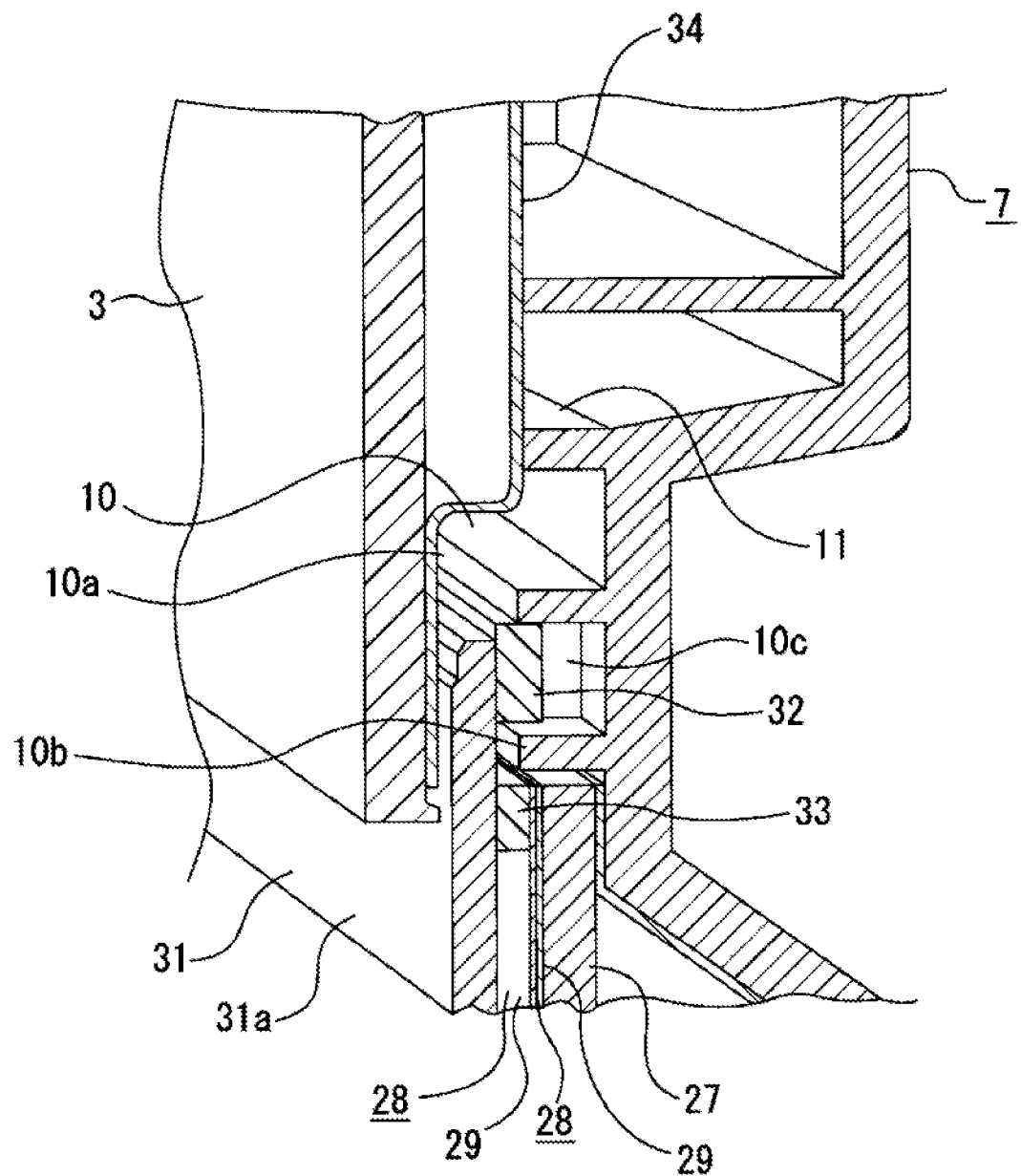
FIG. 18 is an expanded perspective view illustrating a state in which a display is tightly pressed against a display holding portion through a cushion.

The display 31 is tightly pressed against the rib portions 10c, 10c, ... of the display holding portion 10 through a cushion 32 with a frame-shaped outer circumference to be held (see FIG. 18). When the display 31 is held, the connection terminal portion 31b is connected to the circuit board mounted on the rear surface of the back chassis 4.

As described above, by tightly pressing the display 31 against the display holding portion 10 through the cushion 32, it is possible to ensure the stable holding state of the display 31 and also prevent the display 31 from being cracked or damaged.

Since a frame-shaped spacer 33 is disposed between a portion close to the outer circumference of the display 31 and the outer circumference of the optical sheet 28, an appropriate distance is ensured between the display 31 and the optical sheet 28.

Pressure plates 34, 34 formed in a horizontally long shape are formed from the front side at both vertical ends of the display 31 (see FIGS. 2, 3, and 18).

The bezel 3 is mounted on the frame-shaped portion 7 of the back chassis 4. For example, the bezel 3 is mounted on the frame-shaped portion 7 by an appropriate method such as screwing or adhesion. When the bezel 3 is mounted on the frame-shaped portion 7, the outer circumference of the display 31 can be pressed by the bezel 3 through the pressure plates 34, 34, and thus the display 31 is held between the bezel 3 and the back chassis 4. Further, even when the pressure plates 34, 34 are not provided, the display 31 can be pressed by the bezel 3 to be held.

By providing the bezel 3 that tightly presses the outer circumference of the display 31 against the display holding portion 10, it is possible to reliably hold the display 31 and achieve the stability of the holding of the display 31.

Modification Examples

Hereinafter, a modification example of the sheet holding portion holding the optical sheet will be described (see FIGS. 19 to 21).

Figure 19:
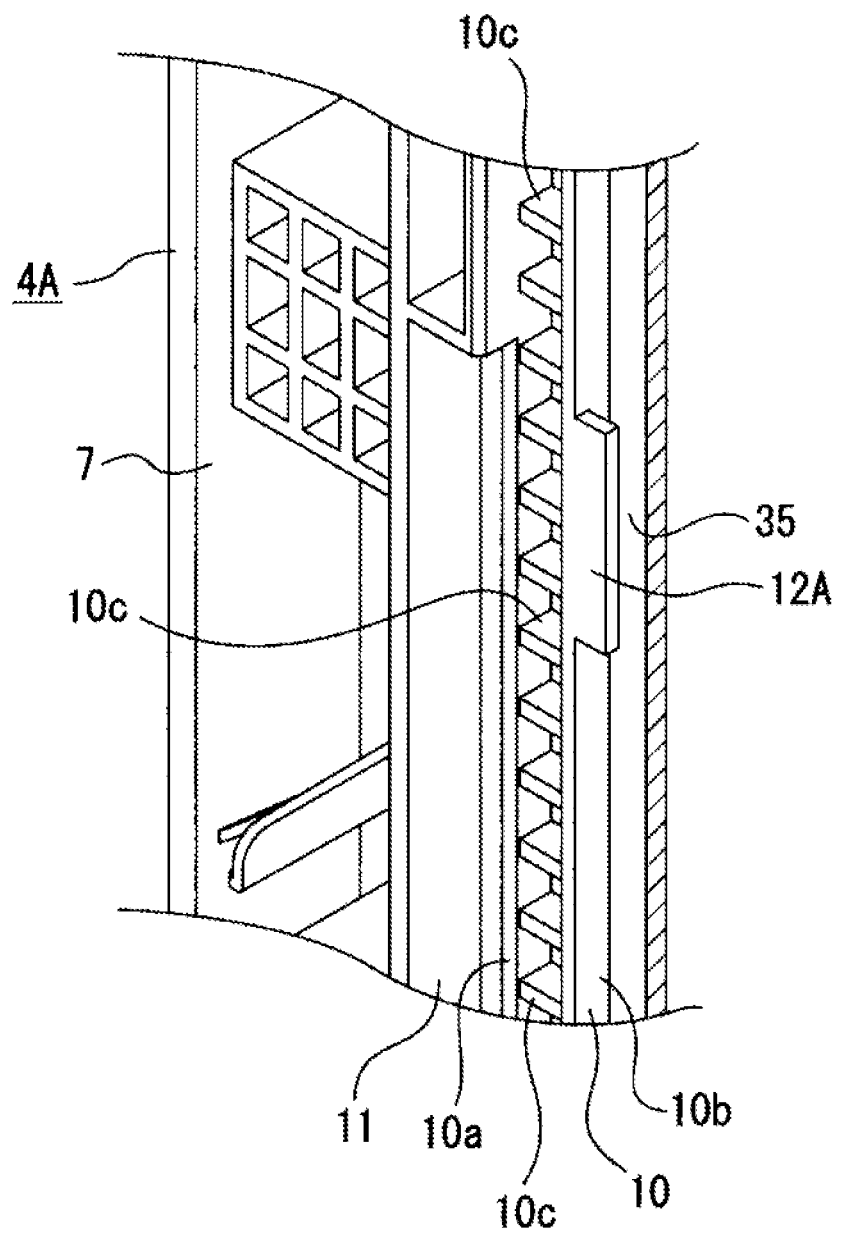
FIG. 19 is an expanded perspective view illustrating a display holding portion together with FIGS. 20 and 21 according to a modification example.

Sheet holding portions 12A, 12A, ... according to the modification example are formed at both right and left ends of a back chassis 4A to be vertically distant and continue to an inner edge portion 10b of a display holding portion 10 (see FIG. 19). The sheet holding portions 12A, 12A, ... are formed to protrude sideward (inward). Gaps 35, 35, ... are formed on the rear side of the sheet holding portions 12A, 12A, ... in consideration of clearance suitable for a sum of the thickness of optical sheets 28A, 28A.

Figure 20:
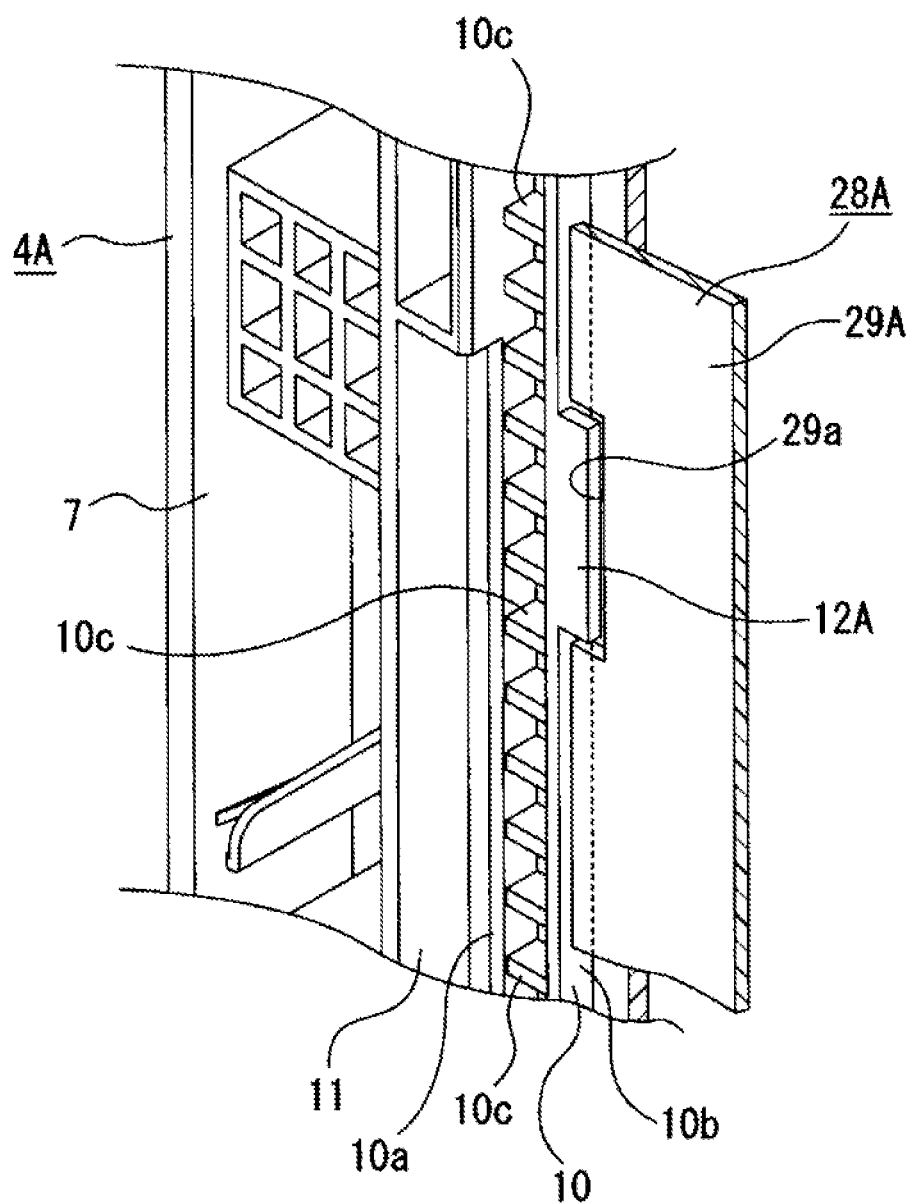
FIG. 20 is an expanded perspective view illustrating a state in which the display holding portion is inserted into a notch.

No protrusion surface portions 30, 30, ... are formed in the optical sheets 28A, 28A, and notches 29a, 29a, ... opened outward are formed at both right and left sides of functional surface portions 29A, 29A to be vertically distant (see FIG. 20).

Figure 21:
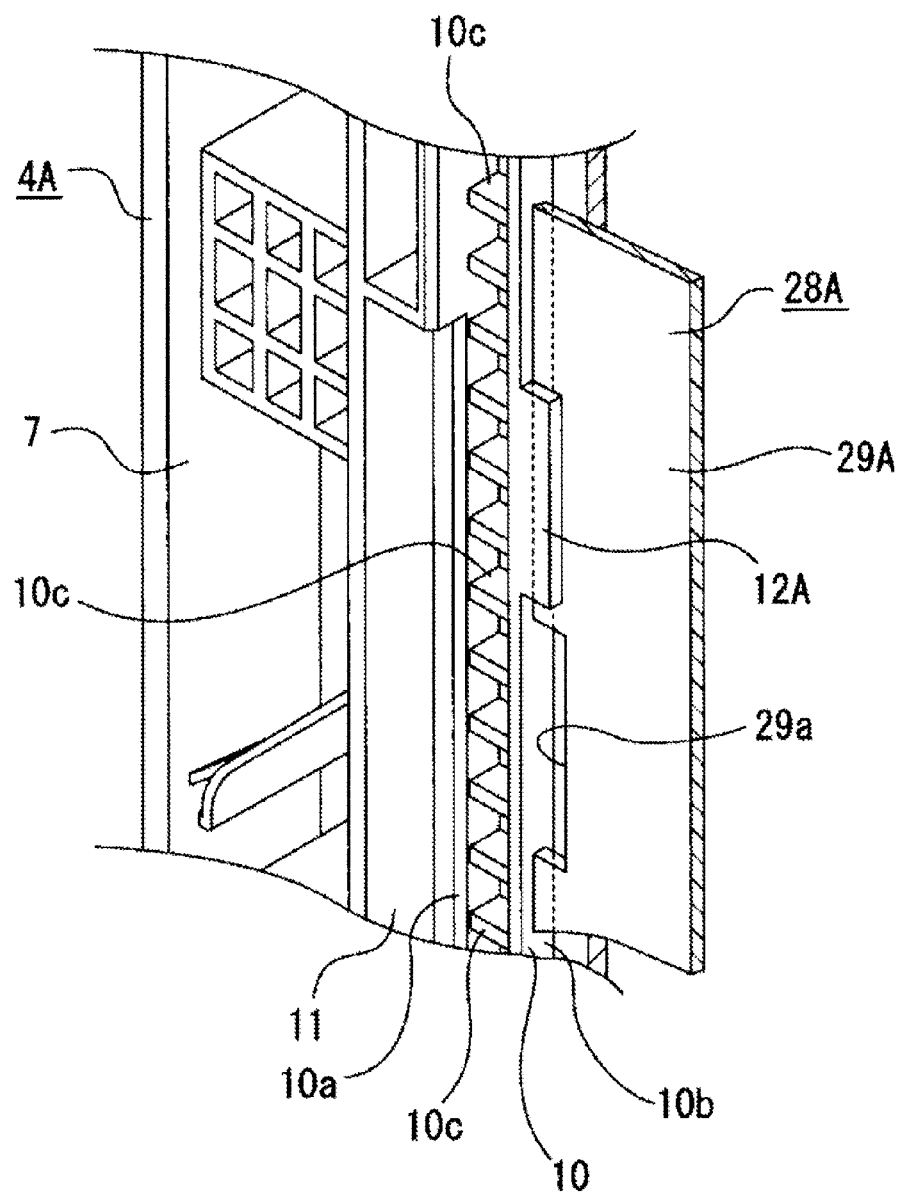
FIG. 21 is an expanded perspective view illustrating a state in which an optical sheet is slid and held in the display holding portion.

The optical sheets 28A, 28A are disposed in the back chassis 4A and then are slid downward so that the sheet holding portions 12A, 12A, ... are respectively inserted into the notches 29a, 29a, ... in a state in which the optical sheets 28A are superimposed (see FIG. 21). When the optical sheets 28A, 28A are slid, both the right and left sides of the optical sheets 28A, 28A are inserted into the gaps 35, 35, ... and are pressed by the sheet holding portions 12A, 12A, ... to be held.

Thus, when the sheet holding portions 12A, 12A, ... are formed, the optical sheets 28A, 28A are held by the sheet holding portions 12A, 12A, ... merely inserting the sheet holding portions 12A, 12A, ... into the notches 29a, 29a, ... and sliding the optical sheets 28A, 28A.

Accordingly, since the optical sheets 28A, 28A are easily held, it is possible to achieve an improvement in workability when the optical sheets 28A, 28A are held in the back chassis 4A.

The example in which the sheet holding portions 12A, 12A, ... are formed at both right and left sides of the back chassis 4A has been described. However, the sheet holding portions 12A, 12A, ... may be formed at both upper and lower sides of the back chassis 4A. In this case, the optical sheets 28A, 28A are slid in the right and left directions and are held by the sheet holding portions 12A, 12A, ....

Figure 22:
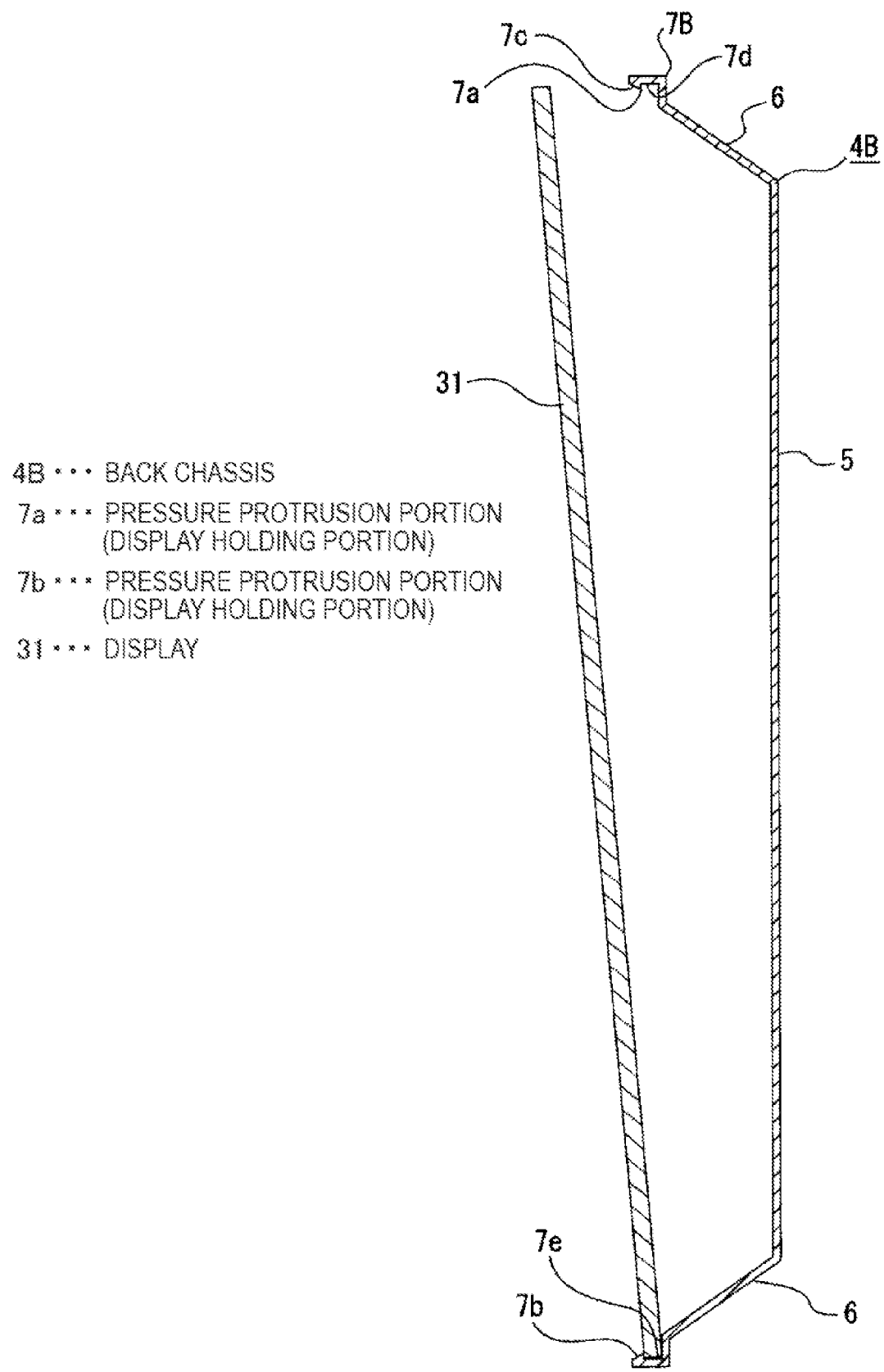
FIG. 22 is a schematic sectional view illustrating a back chassis in which a display is not yet held, together with FIGS. 23 and 24 according to a modification example.

Next, a modification example of the back chassis will be described (see FIGS. 22 to 24).

A back chassis 4B according to the modification example is formed of an elastically deformable material, and pressure protrusion portions 7a and 7b are formed in both upper and lower sides of a frame-shaped portion 7B. The pressure protrusion portions 7a and 7b are located to the front side of the display holding portion 10 to be distant frontward. An inclined surface 7c shifted downward to the rear side is formed on the front side of the pressure protrusion portion 7a.

An engagement groove 7d opened downward is formed between the pressure protrusion portion 7a and the display holding portion 10. An engagement groove 7e opened upward is formed between the pressure protrusion portion 7b and the display holding portion 10.

Figure 23:
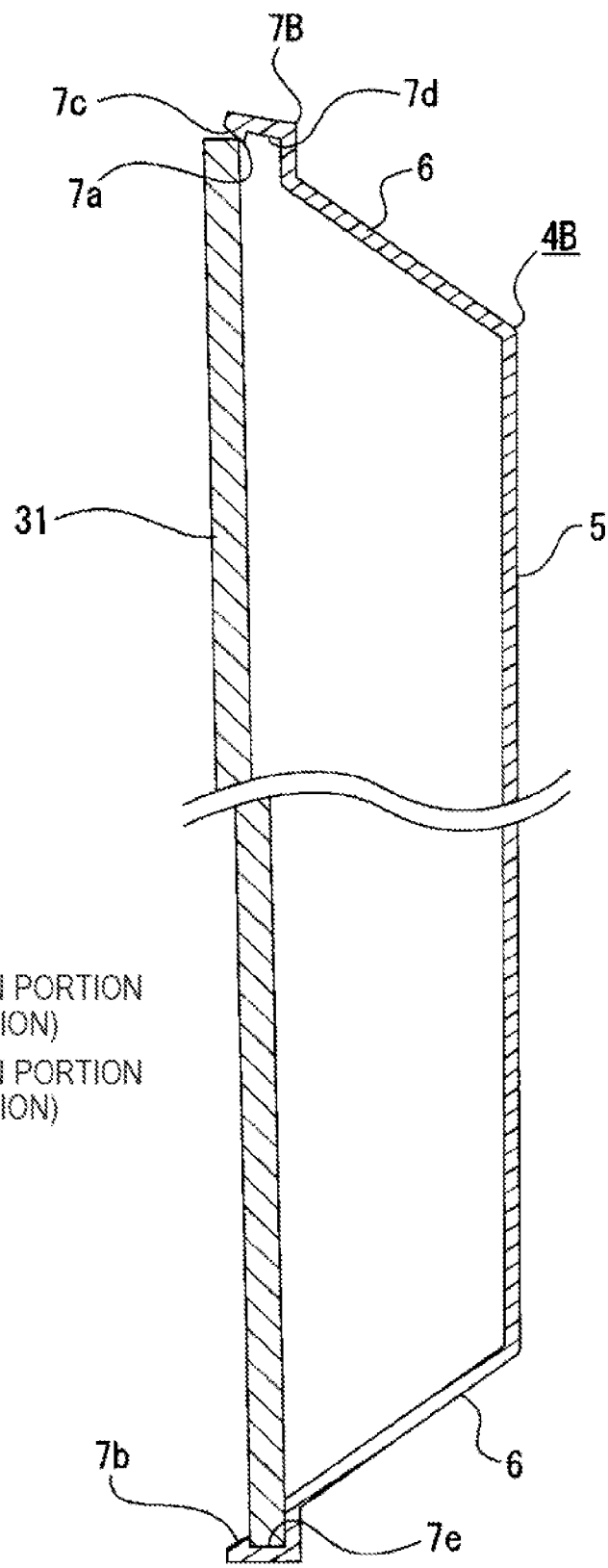
FIG. 23 is a schematic sectional view illustrating a state in which an upper end of the display is tightly pressed by a pressure protrusion portion and the back chassis is elastically deformed.
Figure 24:
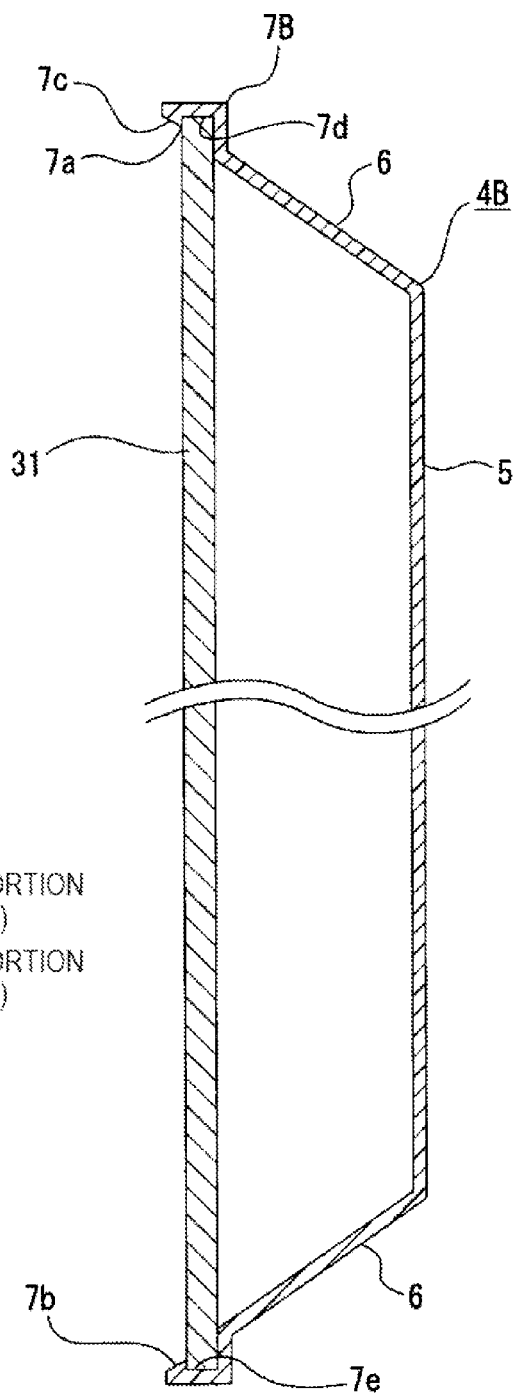
FIG. 24 is a schematic sectional view illustrating a state in which the display is held in the back chassis.

The lower end of the display 31 is inserted into the engagement groove 7e in an inclined state (see FIG. 22) and the upper end of the display 31 is gradually pressed tightly against the inclined surface 7c of the pressure protrusion portion 7a from the front side (see FIG. 23). When the upper end of the display 31 is gradually pressed tightly against the inclined surface 7c, the upper end of the display 31 comes into sliding contact with the inclined surface 7c and the back chassis 4B is gradually deformed elastically. By pushing the upper end of the display 31 up to the engagement groove 7d, the upper end of the display 31 engages with the engagement groove 7d, and both upper and lower ends of the display 31 can be pressed from the front side by the pressure protrusion portions 7a and 7b, respectively, so that the display 31 is held in the back chassis 4B (see FIG. 24).

Accordingly, when the back chassis 4B is used, the pressure protrusion portions 7a and 7b function as display holding portions.

Thus, since the pressure protrusion portions 7a and 7b are formed in the back chassis 4B, the bezel 3 is not necessary. Accordingly, by reducing the number of constituent components, it is possible to achieve the reduction in the manufacturing cost.

The example in which the pressure protrusion portion 7a having the inclined surface 7c is formed on the upper side of the back chassis 4B has been described. However, an inclined surface may be formed in the pressure protrusion portion 7b located on the lower end and the display 31 may come into sliding contact with the inclined surface so that the display 31 can be held in the back chassis.

Further, a pressure protrusion portion having an inclined surface may be formed on one side of the right and left sides of the back chassis 4B and one of both right and left ends of the display 31 may come into sliding contact with the inclined surface so that the display 31 is held in the back chassis.

[Summarization]

As described above, the display device 1 includes the display holding portion 10 that holds the display 31 in the back chassis 4, 4A, or 4B and the pressure protrusion portions 7a and 7b functioning as the display holding portions.

Accordingly, as the configuration of the casing, it is not necessary to provide a middle chassis holding the display 31. By reducing the number of constituent components, it is possible to achieve the reduction in the manufacturing cost and miniaturization.

Additionally, the present technology may also be configured as below.

(1) A display device including:
a display in which an image is displayed on a display surface; and
a back chassis that is disposed on a surface opposite to the display surface of the display,
wherein a display holding portion that holds the display is provided in the back chassis.

(2) The display device according to (1), further including:
a bezel that is formed in a frame shape, and is mounted on the back chassis to press an outer circumference of the display against the display holding portion.

(3) The display device according to (1) or (2),
wherein a cushion is disposed between the display and the display holding portion, and
wherein the display is pressed against the display holding portion through the cushion to be held.

(4) The display device according to any one of (1) to (3),
wherein an optical sheet that controls light oriented toward the display is disposed between the display and the back chassis, and
wherein a sheet holding portion that holds the optical sheet is integrally formed in the back chassis.

(5) The display device according to (4),
wherein a hold hole is formed in the optical sheet,
wherein the sheet holding portion is formed in a protrusion shape protruding toward the display, and
wherein the sheet holding portion is inserted into the hold hole in a manner that the optical sheet is held in the back chassis.

(6) The display device according to any one of (1) to (5),
wherein a lamp that emits light to be incident on the display is disposed,
wherein a reflection sheet that reflects the light emitted from the lamp toward the display is mounted on the back chassis, and
wherein a sheet mounting portion that mounts the reflection sheet is integrally formed in the back chassis.

(7) The display device according to (6), wherein a lamp holder that is mounted on the back chassis, and holds the lamp is provided, and
wherein the lamp holder is mounted on the sheet mounting portion.

(8) The display device according to (7), wherein an optical control member that controls the light emitted from the lamp is disposed between the display and the back chassis, and
wherein a pressure protrusion portion that presses the optical control member is formed in the lamp holder.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a display in which an image is displayed on a display surface;
a back chassis that is disposed on a surface opposite to the display surface of the display, said back chassis having a display holding portion;
a cushion disposed between the display and the display holding portion;
a bezel formed in a frame shape and directly mounted to the back chassis to press an outer circumference of the display against the display holding portion through the cushion so as to avoid use of a middle chassis to hold the display;
a lamp to emit light to be incident on the display;
a reflection sheet, mounted on the back chassis, to reflect the light emitted from the lamp toward the display;
a sheet mounting portion, formed in the back chassis, to mount the reflection sheet; and
a diffusion plate to control the light emitted from the lamp, said diffusion plate being disposed between the display and the back chassis and arranged therein to control bending of the diffusion plate.

2. The display device according to claim 1, further comprising:
a lamp holder mounted on the sheet mounting portion, the lamp holder having plurality of integrally formed portions including a connecting portion, a lamp holding portion to hold the lamp, and a pressure protrusion portion, and
said lamp holding portion being located at an end of said connecting portion of said lamp holder and said pressure protrusion portion being located at a middle portion of said connecting portion.

3. The display device according to claim 2, said diffusion plate being disposed between the display and the back chassis such that the pressure protrusion portion is pressable against a rear surface thereof to control bending of the diffusion plate.

4. The display device according to claim 3, further comprising a second lamp, and in which the lamp holder includes a second lamp holding portion located at a second end of said connecting portion, and in which the middle portion is between lamp holding portions such that said pressure protrusion portion is located between the lamp holding portions.

5. The display device according to claim 3, in which said pressure protrusion portion protrudes along a protrusion axis which does not intersect a longitudinal axis of the lamp.

6. The display device according to claim 1,
wherein an optical sheet that controls light oriented toward the display is disposed between the display and the back chassis, and
wherein a sheet holding portion that holds the optical sheet is integrally formed in the back chassis.

7. The display device according to claim 6,
wherein a hold hole is formed in the optical sheet,
wherein the sheet holding portion is formed in a protrusion shape protruding toward the display, and
wherein the sheet holding portion is inserted into the hold hole in a manner that the optical sheet is held in the back chassis.

* * * * *